US 8,277,001 B2

(12) United States Patent
Vincent et al.

(10) Patent No.: US 8,277,001 B2
(45) Date of Patent: Oct. 2, 2012

(54) STORAGE UNIT FOR ELECTRONIC DEVICES

(75) Inventors: Ross Albert Vincent, Auckland (NZ); Darren Gregory Smith, Auckland (NZ); Robbie David Wells, Auckland (NZ)

(73) Assignee: Thureon Limited, Auckland (NZ)

( * ) Notice: Subject to any disclaimer, the term of this patent is extended or adjusted under 35 U.S.C. 154(b) by 683 days.

(21) Appl. No.: 12/304,626

(22) PCT Filed: Jun. 13, 2007

(86) PCT No.: PCT/NZ2007/000153
§ 371 (c)(1),
(2), (4) Date: Jun. 22, 2009

(87) PCT Pub. No.: WO2007/145538
PCT Pub. Date: Dec. 21, 2007

(65) Prior Publication Data
US 2009/0302727 A1    Dec. 10, 2009

Related U.S. Application Data

(60) Provisional application No. 60/813,108, filed on Jun. 13, 2006.

(51) Int. Cl.
*A47B 96/00* (2006.01)
(52) U.S. Cl. ........................................................ 312/294
(58) Field of Classification Search .................. 312/236, 312/294, 295, 300, 310, 324, 326, 329, 116; 385/135; 454/184, 187; 361/724–727, 679.46–679.5, 694–696; 62/259.2
See application file for complete search history.

(56) References Cited

U.S. PATENT DOCUMENTS

| 452,594 | A | * | 5/1891 | Charles | 312/300 |
| 622,195 | A | * | 4/1899 | Allison | 312/199 |
| 757,003 | A | * | 4/1904 | Wilcox | 312/289 |
| 1,026,561 | A | * | 5/1912 | Charlet | 40/533 |
| 1,227,799 | A | * | 5/1917 | Kaub | 312/300 |
| 1,731,746 | A | * | 10/1929 | Hunter | 312/300 |
| 3,379,484 | A | * | 4/1968 | Kling | 312/300 |
| 3,989,215 | A | * | 11/1976 | Weston | 248/225.11 |

(Continued)

FOREIGN PATENT DOCUMENTS

EP    1 061 621    12/2000

(Continued)

OTHER PUBLICATIONS

Extended Search Opinion for Eur. Pat. Appln. 780865.9, pp. 1-4, Oct. 5, 2010.

(Continued)

*Primary Examiner* — James O Hansen
(74) *Attorney, Agent, or Firm* — Dann, Dorfman, Herrell and Skillman, P.C.

(57) ABSTRACT

A storage unit (10) for electronic devices that comprises an openable housing and a mounting system (40) for receiving and retaining one or more electronic devices within the housing. The mounting system (40) has a hinging assembly (44) that supports two or more brackets (42), each bracket being arranged to receive and retain one or more electronic devices and being hingedly moveable relative to any other bracket by virtue of the hinging assembly to thereby enable access to the bracket for the installation, maintenance or removal of an electronic device or devices.

36 Claims, 30 Drawing Sheets

U.S. PATENT DOCUMENTS

| | | | |
|---|---|---|---|
| 4,569,448 A * | 2/1986 | Graham | 211/74 |
| 5,452,951 A | 9/1995 | Peller | |
| 5,458,407 A * | 10/1995 | Bustos et al. | 312/116 |
| 5,769,516 A * | 6/1998 | Aguilera | 312/321.5 |
| 6,427,936 B1 | 8/2002 | Noel | |
| 2002/0196605 A1 * | 12/2002 | Hilpert et al. | 361/695 |
| 2003/0124971 A1 * | 7/2003 | Williams | 454/184 |
| 2003/0214779 A1 | 11/2003 | Socolofsky | |
| 2004/0164208 A1 | 8/2004 | Nielson | |
| 2004/0264145 A1 | 12/2004 | Miller | |
| 2005/0072745 A1 | 4/2005 | Schmidtk | |
| 2005/0199459 A1 | 9/2005 | Harvey | |

FOREIGN PATENT DOCUMENTS

| | | |
|---|---|---|
| EP | 1 448 040 | 8/2004 |
| GB | 1135194 | 12/1968 |
| GB | 1277348 | 6/1972 |
| GB | 2030782 | 4/1980 |
| WO | 9633598 | 10/1996 |

OTHER PUBLICATIONS

International Search Report of International Application No. PCT/NZ2007/000153, filed Jun. 13, 2007.

* cited by examiner

STORAGE UNIT FOR ELECTRONIC DEVICES

CROSS REFERENCE TO RELATED APPLICATION

This application claims the benefit of U.S. Provisional Application No. 60/813,108, filed Jun. 13, 2006.

FIELD OF THE INVENTION

The present invention relates to a storage unit for electronic devices. In particular, although not exclusively, the storage unit may be utilised to house rack-mount electronic devices.

BACKGROUND TO THE INVENTION

A 19-inch rack is a standardised system for mounting electronic devices in a stack that is 19 inches (482.6 mm) wide. Electronic equipment that is designed to be placed in a 19-inch rack is typically described as "rack-mount" equipment.

A 19-inch rack is typically divided into vertical regions that are 1.75 inches (44.45 mm) in height. Each vertical region of 1.75 inches is commonly known as a "U" for "unit". Typically, rack-mount equipment is designed with a height that is an integral number of U. For example, rack-mount computers are typically 1 U or 2 U in height. Further, rack-mount computers typically have a width of approximately 17.75 inches (450.85 mm) and are available in varying standard lengths.

A 19-inch rack generally comprises two parallel metal uprights that are 0.625 inches (15.875 mm) wide and which are separated by a gap of 17.75 inches, giving an overall rack width of 19 inches. The uprights are provided with repeating mounting hole patterns along their length, the patterns generally comprising sets of three holes. The hole patters repeat every 1.75 inches and divide the uprights into the vertical regions of 1 U as mentioned above.

Rack-mount equipment can be mounted in the 19-inch rack by simply bolting the front panel of the electronic device or module to the uprights of the rack via bolts that lock into the hole patterns. More commonly square-holed racks are utilised and these allow boltless mounting. Some 19-inch racks are also provided with pairs of rack-rails that are mounted perpendicularly to the rack uprights for each of the vertical regions. With rack-rails, the rack-mount equipment may slide in and out on the rails and can also be bolted to the rack uprights for additional support. The rack-rails provide additional support for the electronic equipment and also enable electronic equipment to be slid clear of the rack for inspection or maintenance without the need for complete removal from the rack.

There are various 19-inch rack designs. Some simply comprise the basic framework mentioned above with additional supporting components and others comprise more elaborate enclosed cabinets with doors for example. 19-inch racks are, for example, widely utilised throughout the telecommunication, computing, and entertainment industries to securely house the electronic components of large-scale modular telecommunication, computer and audio-visual systems for example. 19-inch racks are typically free-standing in a room alone or adjacent to other like racks.

In this specification where reference has been made to patent specifications, other external documents, or other sources of information, this is generally for the purpose of providing a context for discussing the features of the invention. Unless specifically stated otherwise, reference to such external documents is not to be construed as an admission that such documents, or such sources of information, in any jurisdiction, are prior art, or form part of the common general knowledge in the art.

It is an object of the present invention to provide an alternative storage unit for rack-mount electronic equipment, or to at least to provide the public with a useful choice.

SUMMARY OF THE INVENTION

In a first aspect, the present invention broadly consists in a storage unit for electronic devices comprising: an openable housing; and a mounting system for receiving and retaining one or more electronic devices within the housing, the mounting system having a hinging assembly that supports two or more brackets, each bracket being arranged to receive and retain one or more electronic devices and being hingedly moveable relative to any other bracket by virtue of the hinging assembly to thereby enable access to the bracket for the installation, maintenance or removal of an electronic device or devices.

Preferably, the hinging assembly may comprise a chain of two or more adjacent hinging components that are interconnected for hinged movement relative to each other, and each hinging component, alone or in cooperation with one or more adjacent hinging components, is arranged to support a bracket so as to allow the supported brackets to be hingedly moveable relative to each other. More preferably, each set of two adjacent hinging components of the chain may be pivotably coupled about a common pivot axis for hinged movement about that pivot axis.

Preferably, the hinging assembly may be arranged to support that brackets in a cantilevered fashion such that each bracket is hingedly movable into an abutting relationship with adjacent brackets or alternatively hingedly moveable away from an abutting relationship with adjacent brackets in order to enable access to the bracket.

Preferably, each bracket may be arranged to receive and retain one or more rack-mount electronic devices of a particular U-size. In one form, each bracket is releasbly coupled to either one or multiple adjacent hinging components of the hinging assembly, the number of hinging components required being equal to the integer U-size of the bracket. In another form, each bracket may be permanently coupled to either one or multiple adjacent hinging components of the hinging assembly, the number of hinging components required being equal to the integer U-size of the bracket. More preferably, brackets that require multiple adjacent hinging components for support may be arranged to couple those adjacent hinging components together to prevent them from hingedly moving relative to each other.

Preferably, the bracket(s) may be supported by the hinging assembly in a cantilever fashion.

Preferably, each bracket may be provided with an operable locking mechanism that is arranged to cooperate with a like locking mechanism of an adjacent bracket to lock the brackets together to prevent hinged movement of those brackets relative to each other.

Preferably, the housing may comprise one or more openable doors for opening and closing the housing.

Preferably, the housing may comprise a base plate and two opposed openable doors that are hingedly attached to the base plate via hinging mechanisms at either end of the base plate.

Preferably, the doors of the housing may be hingedly attached such that they are both movable between closed and open positions, such that when both doors are in the closed position the mounting system and any installed electronic devices are enclosed within the housing and when both the doors are in an open position the mounting system and any electronic devices are exposed and accessible. More preferably, the doors of the housing may have an associated locking mechanism that is operable to lock the doors in a closed position.

Preferably, the hinging assembly of the mounting system may be fixed within the housing to the base plate of the housing.

Preferably, the storage unit further may comprise a temperature control system for controlling the temperature within the housing. The temperature control system may comprise an external air conditioning system arranged to connect to the unit for controlling one or more environmental parameters or conditions within the internal environment of the housing when closed and/or an integrated cooling system that creates a forced ventilation effect through the housing with ambient air from the external environment. By way of example, the integrated cooling system may comprise one or more operable fans fixed within the housing that are arranged to create ventilating air flows through the housing and associated vents of the housing. The external air-conditioning unit may be connected to ports provided in the housing via a manifold and air-conditioning ducting that forces cooler or conditioned air into the housing. The temperature control system may comprise monitoring sensors that are arranged to measure particular environmental parameters within the integrated environment and a control system that is arranged to control the external air conditioning system and/or integrated cooling system in response to the measurements obtained by the monitoring sensors.

Preferably, the housing may comprise a user interface that is arranged to communicate with one or more of the electronic devices retained within the storage unit.

Preferably, the housing may be releasably securable to a wall-mount bracket that is arranged to be fixed to a wall or other vertical surface or frame.

In a second aspect, the present invention broadly consists in a storage assembly for electronic devices comprising: a mounting system for receiving and retaining one or more electronic devices, the mounting system having a hinging assembly that supports two or more brackets, each bracket being arranged to receive and retain one or more electronic devices and being hingedly moveable relative to any other bracket by virtue of the hinging assembly to thereby enable access to the bracket for the installation, maintenance or removal of an electronic device or devices.

Preferably, the hinging assembly may comprise a chain of two or more adjacent hinging components that are interconnected for hinged movement relative to each other, and each hinging component, alone or in cooperation with one or more adjacent hinging components, is arranged to support a bracket so as to allow the supported brackets to be hingedly moveable relative to each other. More preferably, each set of two adjacent hinging components of the chain may be pivotably coupled about a common pivot axis for hinged movement about that pivot axis.

Preferably, the hinging assembly may be arranged to support that brackets in a cantilevered fashion such that each bracket is hingedly movable into an abutting relationship with adjacent brackets or alternatively hingedly moveable away from an abutting relationship with adjacent brackets in order to enable access to the bracket.

Preferably, each bracket may be arranged to receive and retain one or more rack-mount electronic devices of a particular U-size. In one form, each bracket may be releasably coupled to either one or multiple adjacent hinging components of the hinging assembly, the number of hinging components required being equal to the integer U-size of the bracket. In another form, each bracket may be permanently coupled to either one or multiple adjacent hinging components of the hinging assembly, the number of hinging components required being equal to the integer U-size of the bracket. More preferably, brackets that require multiple adjacent hinging components for support may be arranged to couple those adjacent hinging components together to prevent them from hingedly moving relative to each other.

Preferably, the bracket(s) may be supported by the hinging assembly in a cantilever fashion.

Preferably, each bracket may be provided with an operable locking mechanism that is arranged to cooperate with a like locking mechanism of an adjacent bracket to lock the brackets together to prevent hinged movement of those brackets relative to each other.

Preferably, the storage assembly may further comprise a mounting plate to which the mounting system is fixed.

In a third aspect, the present invention broadly consists in a storage unit for electronic devices comprising: an openable housing; and a mounting system for receiving and retaining one or more electronic devices within the housing, the mounting system having a hinging assembly that is arranged to support two or more electronic devices such that the supported electronic devices are hingedly moveable relative to each other by virtue of the hinging assembly to thereby enable access to each supported electronic device.

Preferably, the hinging assembly may comprise a chain of two or more adjacent hinging components that are interconnected for hinged movement relative to each other, and each hinging component, alone or in cooperation with one or more adjacent hinging components, is arranged to support an electronic device in a cantilevered fashion.

Preferably, each hinging component, alone or in cooperation with one or more adjacent hinging components, may be arranged to receive and retain an electronic device by direct connection of the device to the hinging component(s).

Preferably, each hinging component, alone or in cooperation with one or more adjacent hinging components, may be arranged to support a bracket that is arranged to receive and retain one or more electronic devices. More preferably, the hinging components of the hinging assembly may be arranged to support at least two brackets, each bracket being arranged to receive and retain one or more electronic devices and the brackets being hingedly moveable relative to each other by virtue of the hinging assembly.

Preferably, the electronic devices may be rack-mount electronic devices.

Other aspects of the invention are described below.

In a further aspect, the present invention may broadly consist in a storage unit for electronic devices comprising: an openable housing; and a mounting system for receiving and retaining one or more electronic devices within the housing, the mounting system having a hinging assembly that supports at least one bracket, each bracket being arranged to receive and retain one or more electronic devices and being moveable relative to any other bracket and the housing by virtue of the hinging assembly to thereby provide access to the bracket for the installation or removal of an electronic device or devices.

Preferably, the hinging assembly may comprise a chain of adjacent hinging components that are interconnected for hinged movement relative to each other. More preferably, each hinging component may be arranged to support a bracket alone or in cooperation with one or more adjacent hinging components.

Preferably, each hinging component may be arranged to rigidly couple to an attachment part of a bracket, either along or in cooperation with one or more adjacent hinging components, to thereby support the bracket in a cantilever fashion. More preferably, the hinging components may be interconnected to allow for pivotal movement relative to adjacent hinging components thereby allowing any supported brackets to pivot relative to each other as desired. For example, the hinging assembly may be moved between a compact position in which all the hinging components and supported brackets are aligned and a fanned-out position in which all hinging component are pivoted relative to each other in an arc-shape causing the supported brackets to be fanned-out relative to each other to provide access to the brackets for installation or removal of electronic devices.

Preferably, each bracket may be provided with an operable locking mechanism that is arranged to cooperate with a like locking mechanism of an adjacent bracket to lock the brackets together so that they cannot be moved relative to each other via the hinging assembly.

Preferably, the brackets may be arranged to receive and retain rack-mount electronic devices. The brackets may vary in capacity and there may be single brackets that are arranged to receive and retain one electronic device or dual brackets that are arranged to receive and retain two electronic devices. Further, the brackets may vary in size to accommodate electronic devices of varying height, for example of at least 1 U and above.

Preferably, the mounting system may be modular such that hinging components of the hinging assembly are arranged to releasably support the brackets. For example, brackets of varying capacity and size may be arranged on the hinging components of the hinging assembly as desired for a particular system or selection of electronic devices that is to be stored in the storage unit.

Preferably, each hinging component may be dimensioned to support, on its own, single or dual 1 U brackets that are arranged to receive and retain one or two 1 U rack-mount electronic devices respectively. Larger single or dual brackets, for example those arranged to receive and retain one or two 2 U or bigger rack-mount electronic devices respectively, are arranged to be supported by a number of adjacent hinging components, the number being proportional to the integer U size of the bracket. For example, 2 U brackets are supported by 2 adjacent hinging components, 3 U brackets are supported by 3 adjacent hinging components, and so on. The adjacent hinging components that support such a larger bracket effectively operate as a single larger hinging component as the individual adjacent hinging components that form the larger hinging component cannot move relative to each other when supporting the larger bracket.

Preferably, the hinging assembly may be fixed to or within the housing via a mounting plate that is securely attached to a part of the housing. More preferably, the mounting plate may be pivotally coupled to one of the hinging components of the hinging assembly that is on the end of the chain.

Preferably, the housing may comprise a base plate and two opposed openable doors that are hingedly attached via hinging mechanisms at either end of the base plate. More preferably, the doors are hingedly attached such that they are both movable between closed and open positions, such that when both doors are in the closed position the mounting system and any electronic devices are enclosed within the housing and when both the doors are in an open position the mounting system and any electronic devices are exposed and accessible.

Preferably, the doors may have an associated locking mechanism that is operable to lock the doors in a closed position.

Preferably, the storage unit may comprise an air conditioning system for controlling one or more environmental parameters or conditions within the internal environment of the housing when closed.

In one form, the air conditioning system may comprise monitoring sensors that may be arranged to measure particular environmental parameters within the internal environment, operable fans that are arranged to create air flows through the housing and associated vents of the housing, and a control system that is arranged to control the operable fans in accordance with the measurements obtained by the monitoring sensors. By way of example, the monitoring sensors may be arranged to sense temperature and/or humidity within the internal environment of the housing. Additionally, or alternatively, the storage unit may be provided with an external air conditioning system that is coupled to the internal environment via inlet/outlet ports of the housing and that is arranged to actively control the temperature and/or humidity of the internal environment.

Preferably, the storage unit may comprise a user interface that is mounted to the housing and that is arranged to communicate with one or more of the electronic devices retained within the storage unit. More preferably, the user interface may comprise an input device or devices, such as a keyboard and mouse, and an output display. In one form, the user interface is provided in a cavity of one of the doors of the housing that is hidden by an openable cover.

In a further aspect, the present invention may broadly consist in a storage unit for electronic devices comprising: an openable housing; and a mounting system within the housing having a least two brackets, each bracket being arranged to receive and retain one or more electronic devices, the brackets being operatively connected together for movement relative to each other between a compact arrangement in which the brackets are brought together in a side-by-side relationship for storage of the electronic device(s) installed in the brackets and other arrangements that provide access to each of the individual brackets for the installation, maintenance or removal of electronic devices.

In a further aspect, the present invention may broadly consist in a storage unit for electronic devices comprising: an openable housing; and a mounting system within the housing having one or more brackets, each bracket being arranged to receive and retain one or more electronic devices, and a chain of hinging components that are connected together for hinged movement relative to each other, each hinging component being arranged to support a bracket either alone or with one or more adjacent hinging components.

In a further aspect, the present invention may broadly consist in a storage unit for electronic devices comprising: an openable enclosure for the electronic devices; and a mounting system that may be arranged to support an arrangement of modular brackets, each bracket being arranged to receive and retain a particular size and number of electronic devices, the mounting system being arranged to allow relative movement between the supported brackets so that are individually separable from each other to provide access for the installation, maintenance or removal of electronic devices while also being moveable together into a compact arrangement for storage of the electronic devices.

In a further aspect, the present invention may broadly consist in a storage assembly for electronic devices comprising a mounting system for receiving and retaining one or more electronic devices, the mounting system having a hinging assembly that supports at least one bracket, each bracket being arranged to receive and retain one or more electronic devices and being moveable relative to any other bracket by virtue of the hinging assembly to thereby provide access to the bracket for the installation or removal of an electronic device or devices.

The preferential features recited in respect of each aspect of the invention may also apply to the other aspects of the invention.

The phrase "rack-mount electronic devices" as used in this specification and claims is intended to refer to any electronic devices, components or modules that are suitable for rack-mount installation into a conventional 19-inch rack or alternatively any other rack-size standard.

The term 'comprising' as used in this specification and claims means 'consisting at least in part of', that is to say when interpreting statements in this specification and claims which include that term, the features, prefaced by that term in each statement, all need to be present but other features can also be present.

The invention consists in the foregoing and also envisages constructions of which the following gives examples only.

BRIEF DESCRIPTION OF THE DRAWINGS

Preferred embodiments of the invention will be described by way of example only and with reference to the drawings, in which.

DETAILED DESCRIPTION OF PREFERRED EMBODIMENTS

The present invention relates to a storage unit for electronic devices. In particular, the storage unit is designed to securely house a number of electronic devices that preferably form part of an overall system, although independent electronic devices may also be stored if desired. The storage unit is designed primarily to accommodate electronic devices that have a standard rack-mount profile, i.e. electronic equipment that is dimensioned and arranged for mounting in a conventional 19-inch rack. It will be appreciated that the unit could be modified to suit other electronic device size standards also.

A preferred embodiment of the storage unit 10 will now be described with reference to FIGS. 1A to 27. At a broad level, the storage unit 10 comprises an openable housing that encloses a mounting system that is capable of securely receiving, retaining and supporting a number of rack-mount electronic devices. First, the housing of the storage unit 10 will be described with reference to FIGS. 1A-8. Secondly, the internal mounting system will be described with references to FIGS. 8-21. And thirdly, various mounting and support assemblies for the storage unit 10 will be described with reference to FIGS. 22-25. An air-conditioning manifold will be described with reference to FIGS. 26 and 27.

Figure 1A:
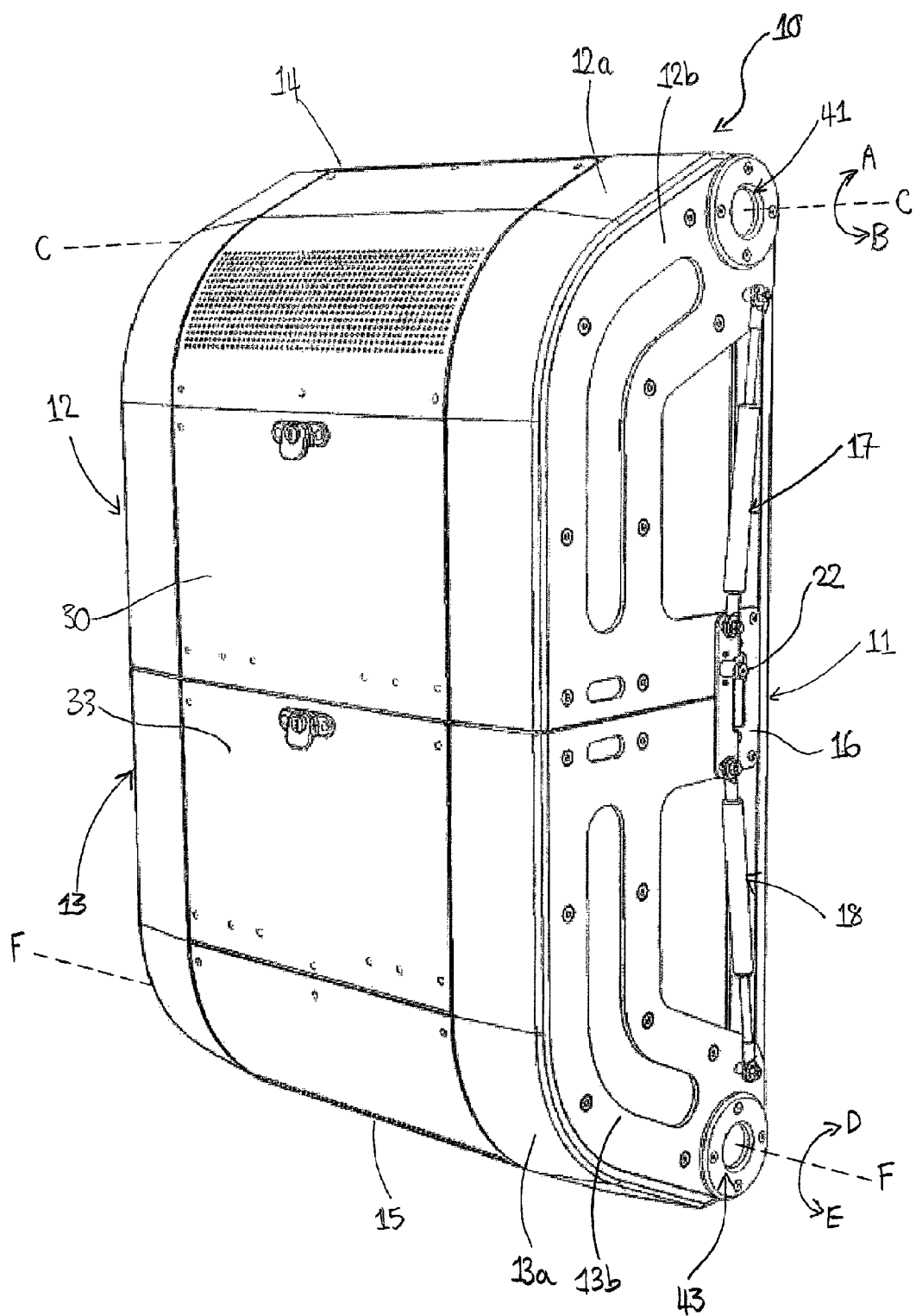
FIG. 1A shows a front right-side perspective view of a preferred embodiment of the storage unit of the present invention.
Figure 1B:
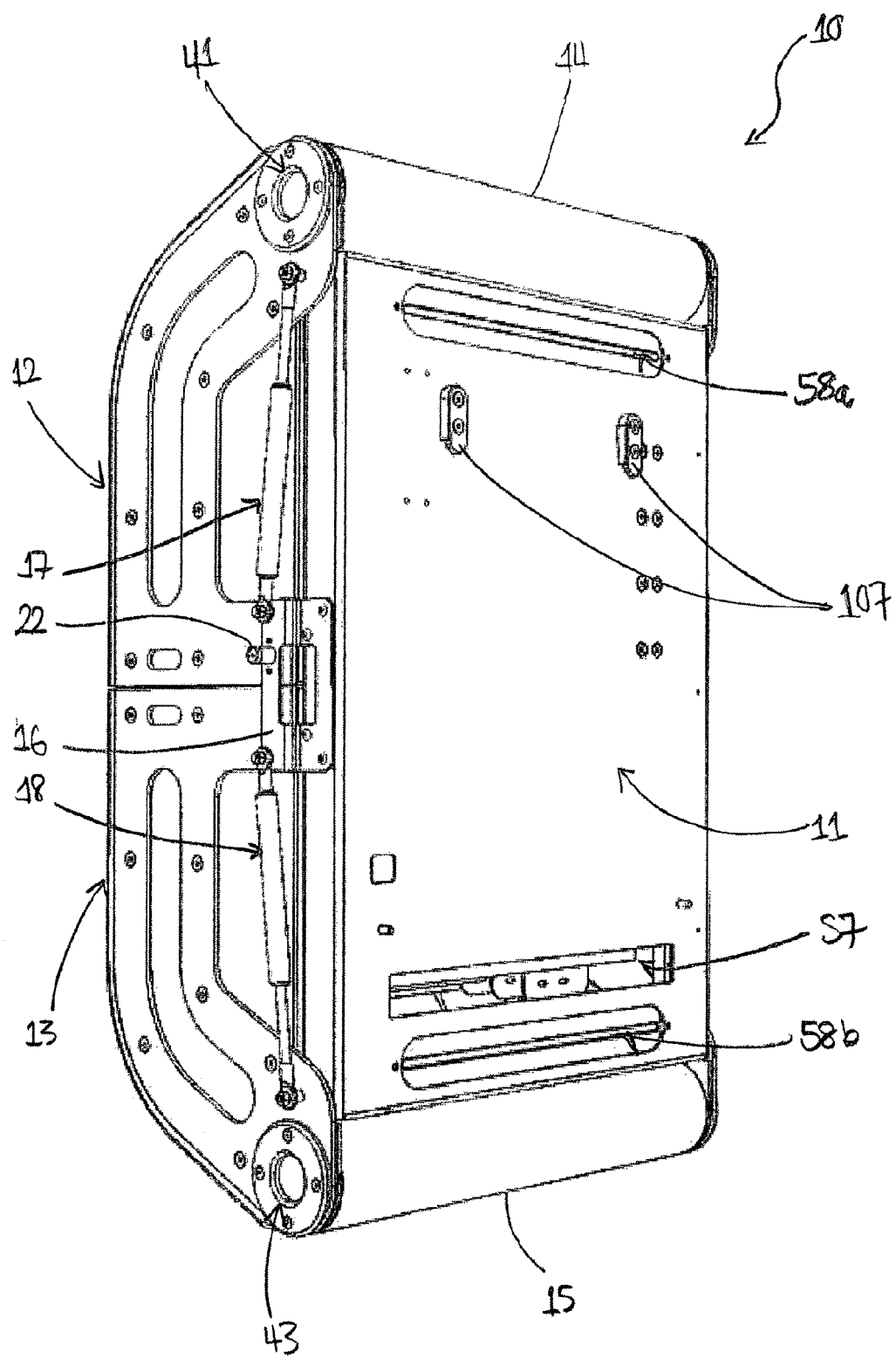
FIG. 1B shows a rear right-side perspective view of the preferred embodiment storage unit.

Referring to FIGS. 1A and 1B, the housing of the preferred embodiment storage unit 10 comprises a base plate 11, an upper door 12 and a lower door 13, the doors 12, 13 being arranged for movement between open and closed positions relative to the base plate 11. In the preferred embodiment, the upper and lower doors 12, 13 of the housing are pivotally or hingedly coupled at or toward opposed ends of the base plate 11 and are operable to swing or pivot outwardly away from each other and the base plate 11 into an open position or inwardly toward each other and the base plate into a closed position.

Figure 3:
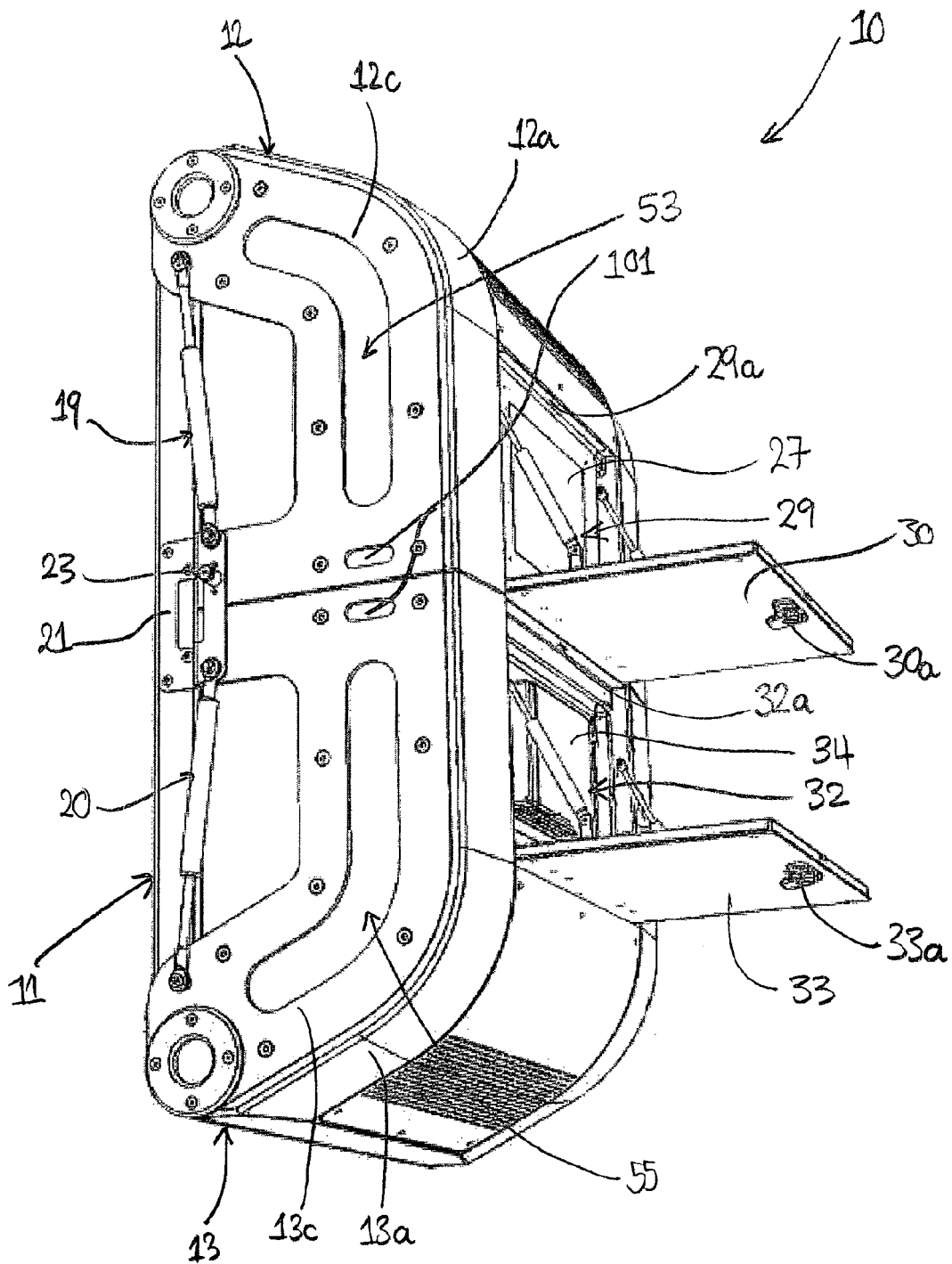

Referring to FIGS. 1A and 3, the doors 12, 13 each comprises a front surface 12a, 13a that is attached to or integrally formed with left 12b, 13b and right 12c, 13c side surfaces respectively. Therefore, when the doors 12, 13 are in a closed position against the base plate 11, an enclosed housing is formed. In the preferred embodiment, the front surfaces 12a, 13a of the doors 12, 13 are flat and parallel with the base plate 11 toward the central part of the housing and then bend or curve down toward the base plate at the top 14 and bottom 15 edges. The side panels or surfaces 12b, 12c, 13b, 13c of the doors 12, 13 are substantially flat and are shaped to compliment the curve of the front surfaces or panels 12a, 13a.

In the preferred embodiment, the upper door 12 is pivotally coupled toward the top edge 14 of the base plate 11 via an upper hinging mechanism 41 or hinge couplings, and is operable to pivot back and forth in either direction indicated by arrows A or B about an axis that is generally indicated by the line CC. Similarly, the lower door 13 of the housing is pivotally coupled toward the bottom edge 15 of the base plate 11 via a hinging mechanism 43 or hinge couplings, and is operable to swing or pivot in either direction indicated by arrows D or E about an axis that is generally indicated by line FF. In essence, the upper and lower doors 12, 13 form a clam-shell arrangement with the base plate 11.

Each of the doors 12, 13 is preferably also operatively coupled to the base plate 11 by a pair of hydraulic openers, such as air rams. For example, FIGS. 1A and 1B show the right-side of the housing and, in particular, hydraulic openers 17 and 18 that operatively couple the upper and lower doors 12, 13 respectively to a central bracket 16 attached to or integrally formed with the base plate 11. FIG. 3 shows the left-side of the housing that has a similar arrangement with hydraulic openers 19 and 20 operatively coupling the upper and lower doors 12, 13 respectively to another central bracket 21 of the base plate 11. In the preferred embodiment, the hydraulic openers 17, 18, 19, 20 are arranged to urge the upper and lower doors 12, 13 toward an open position. In particular, they are arranged to apply force to the upper and lower doors 12, 13 to swing or pivot them in directions A and E respectively such that the doors are each biased toward an open position.

Figure 8:
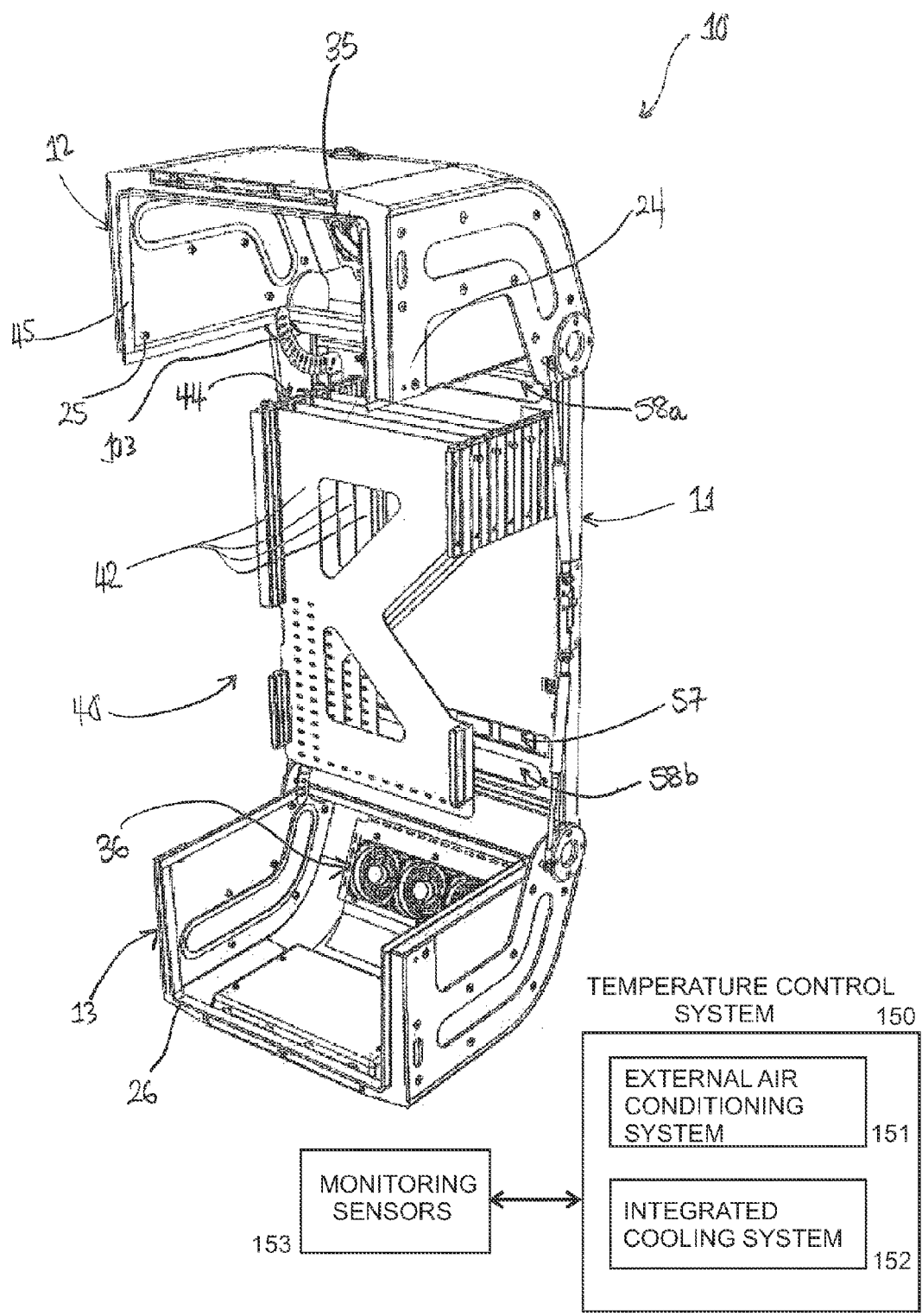
FIG. 8 shows a front right-side perspective view of the preferred embodiment storage unit showing the doors of the housing in a fully open position and the mounting system positioned in a compact arrangement and a schematic depiction of a temperature control system.

FIGS. 1A and 1B shows both doors 12, 13 in a closed position where the mounting system and any installed electronic devices are enclosed within the housing. FIG. 8 shows both doors 12, 13 in a fully open position where the mounting system exposed and accessible to install, remove or maintain electronic devices. In the preferred embodiment, the doors 12, 13 are retained in the closed position against the force of the hydraulic openers 17, 18, 19, 20 by an operable locking mechanism. By way of example, the locking mechanism comprises two operable locking devices 22, 23 that are provided on the central brackets 16, 21 of the base plate 11 and that are arranged to cooperate with complementary locking apertures 24, 25 provided on opposite sides of the upper door 12 to lock the upper door 12 in a closed position. In particular, the locking devices 22, 23 comprise moveable locking bolts that engage with locking apertures 24, 25 of the upper door 12. The locking bolts are preferably automatically biased to engage with the locking apertures 24, 25 when the upper door 12 is bought into the closed position by force applied by a user against the hydraulic openers 17, 19. The locking bolts of the locking devices 22, 23 may be disengaged from the locking apertures 24, 25 to unlock and release the upper door 12 via an operable button, knob, key or the like.

In the preferred embodiment, the lower door 13 does not have an operable locking mechanism for locking it in a closed position. Rather, the lower door 13 is held in a closed position via engagement with the upper door 12 when locked in a closed position. Referring to FIG. 8, an outer edge 45 of the upper door 12 is arranged to engage with, abut or overlap a flange 26 projecting from the lower door 13 when both doors are in the closed position thereby holding the lower door 13 in place. In operation, this requires that the lower door 13 is forced into a closed position slightly before the upper door 12 when closing the housing to ensure the flange 26 of the lower door 13 is beneath the outer edge 45 of the upper door 12 ready for engagement.

It will be appreciated that any other locking or latching mechanisms could be utilised to secure the doors of the housing in a closed position. In alternative arrangements, locking or latching mechanisms, whether automatically or manually operable, may be provided on either door or both, and on one or both sides of each door.

In operation, the doors 12, 13 of the housing may be opened by a user by unlocking the locking devices 22, 23, for example with a knob, button, key or the like. Once the locking devices 22, 23 are unlocked, the hydraulic openers 17, 18, 19, 20 act to force both doors 12, 13 to swing outwardly relative to each other and the base plate 11 in directions A and E respectively into an open position as shown in FIG. 8. To close the housing, the a user is able to apply force to each of the doors 12, 13 to cause them to swing back inwardly toward each and the base plate 11 in directions B and D respectively into the closed position shown in FIGS. 1A and 1B. As mentioned above, the user must bring the lower door 13 into the closed position abutting the base plate 11 prior to the upper door 12. This is because the preferred embodiment upper door 12 holds the lower door 13 in place via the overlapping relationship of the edge 45 of the upper door 12 with the flange 26 of the lower door 13. As mentioned, the upper door 12 is held in a closed position abutting the base plate via automatic or manual operation of the locking devices 22, 23.

Figure 2:
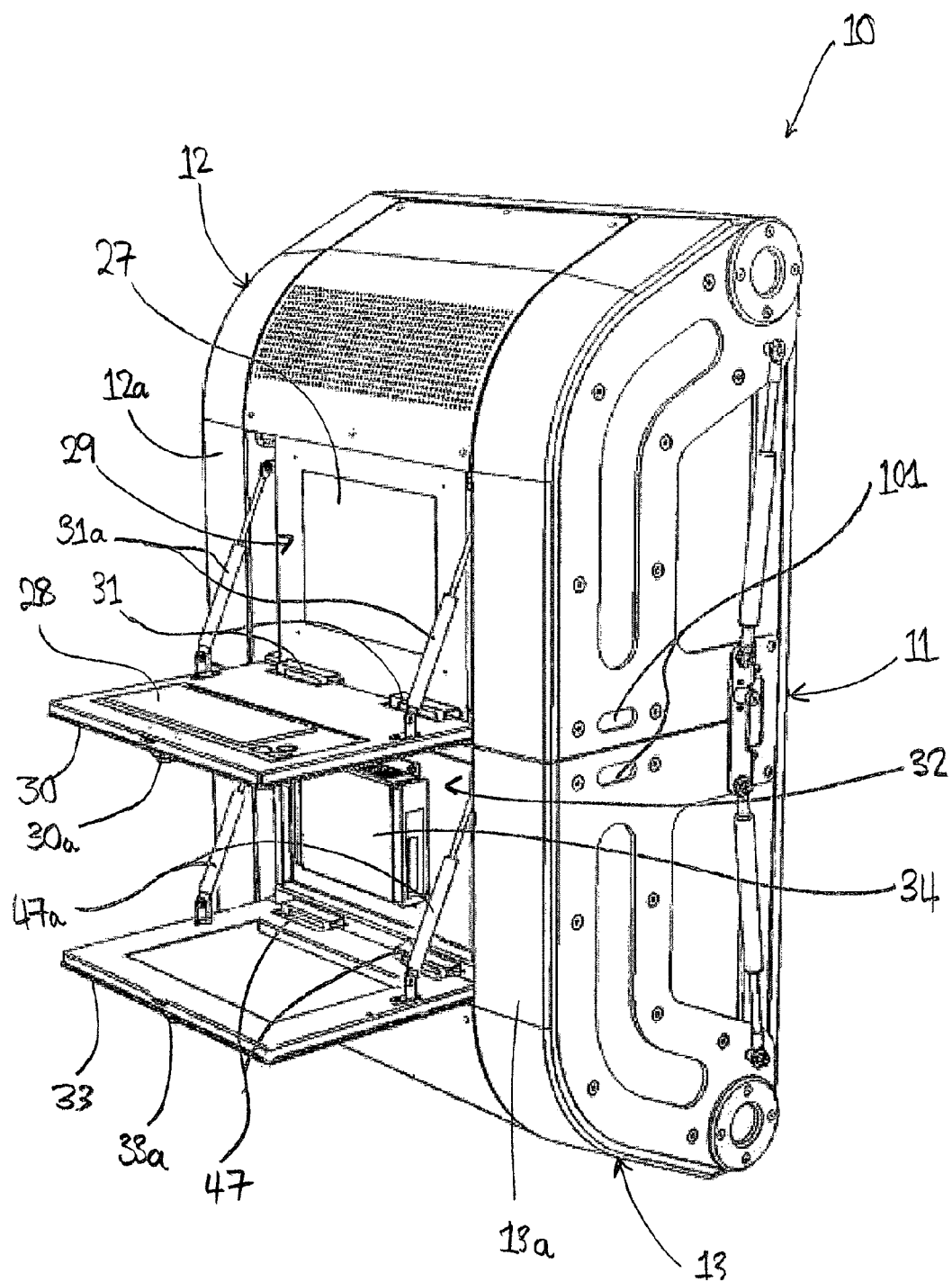
FIGS. 2 and 3 show right and left-side perspective views respectively of the preferred embodiment storage unit with panels of the doors of the housing in an open position.

Referring to FIGS. 2 and 3, the storage unit 10 may comprise a user interface that is mounted to the housing and that is arranged to communicate with one or more of the electronic devices mounted in the storage unit. It will be appreciated that the user interface may comprise a combination of various types of input and output devices, for example a keyboard, mouse, display and the like. For larger systems or collections of electronic device, more than one storage unit may be teamed or utilised together to store the components. It will be appreciated that in this situation only one storage unit need have a user interface, such as an LCD, keyboard and tape drive.

In the preferred embodiment, the user interface is mounted in the front surface 12a of the upper door 12 of the housing and comprises a display 27 and a keyboard 28. The display 27, such as an LCD or the like, is mounted within a cavity 29 provided in the front face or surface 12a of the upper door 12 of the housing. The keyboard 28 is mounted to the inner surface of an openable panel or cover 30 associated with the cavity 29. The cover 30 is preferably pivotally coupled to the cavity 29 of the upper door 12 via a pair of hinging assemblies or hinges 31 that enable the cover to be moved between a closed position that hides the user interface as shown in FIGS. 1A and 1B and an open position that exposes the user interface as shown in FIGS. 2 and 3.

In the preferred embodiment, a pair of air rams 31a extend between the cavity 29 and the cover 30. The air rams 31a are arranged or configured to urge or bias the cover 30 toward the open position. The cover 30 is provided with an operable locking mechanism 30a toward the centre of the top edge of the cover. When the panel 30 is in the closed position, the locking mechanism 30a is operable to lock the cover in place via locking engagement with a complimentary locking aperture or catch 29a provided in the cavity 29.

In operation, the cover 30 may be closed by a user via the application of force to fold the cover up into the cavity 29 to hide and protect the user interface with the hinging assemblies 31 being arranged to secure or lock the cover 30 in place. To open the cover, the locking mechanism 30a is operated to unlock or release the cover. The air rams 31a will then automatically lower or pivot the cover 30 into the open position.

It will be appreciated that the user interface may be arranged to communicate with one or more of the electronic devices stored within the housing or other external devices wirelessly or via cables as desired. In particular, the cavity 29 may be provided with cable ports into the housing or the like.

It will be appreciated that the cover 30 may be pivotally coupled for engagement with cavity 29 via other hinge assemblies or pivotal coupling arrangements in alternative embodiments. Further, other hinging assembly may be configured to be self-locking to enable the cover to be a push-panel that opens in response to the application of force. In particular, it would be appreciated that a hinging assembly could be arranged to unlock or release the cover to fold down away from the cavity 29 to an open position in response to the application of a small amount of force to the upper end of the cover. In addition, it will be appreciated that air rams 31a are not necessarily essential and that other mechanisms such as wire stays could be utilised to prevent the cover 30 from over extending when opened.

The lower door 13 of the housing may also be provided with a cavity 32 and an associated openable cover 33. In the preferred embodiment, cover 33 may be pivotally coupled to move and lock into position in the same manner as that described in respect of the cover 30 of the upper door 12. In particular, cover 33 is provided with hinging assemblies or hinges 47 that pivotally couple the cover 33 into the cavity 32. Air rams 47a, a locking mechanism 33a, and a complementary locking aperture 32a or catch are also provided. In the preferred form, an electronic device, such as a tape drive 34 or the like, may be securely mounted within the cavity 32 of the lower door 13. Access to the tape drive 34 is provided when the cover 33 is open, and the tape drive 34 is hidden away within the cavity 32 when the cover is closed. It will be appreciated that the tape drive 34 or other electronic device mounted within the lower door 13 may communicate with one or more of the electronic devices stored within the housing or other external devices wirelessly or via cables as desired.

Figure 4:
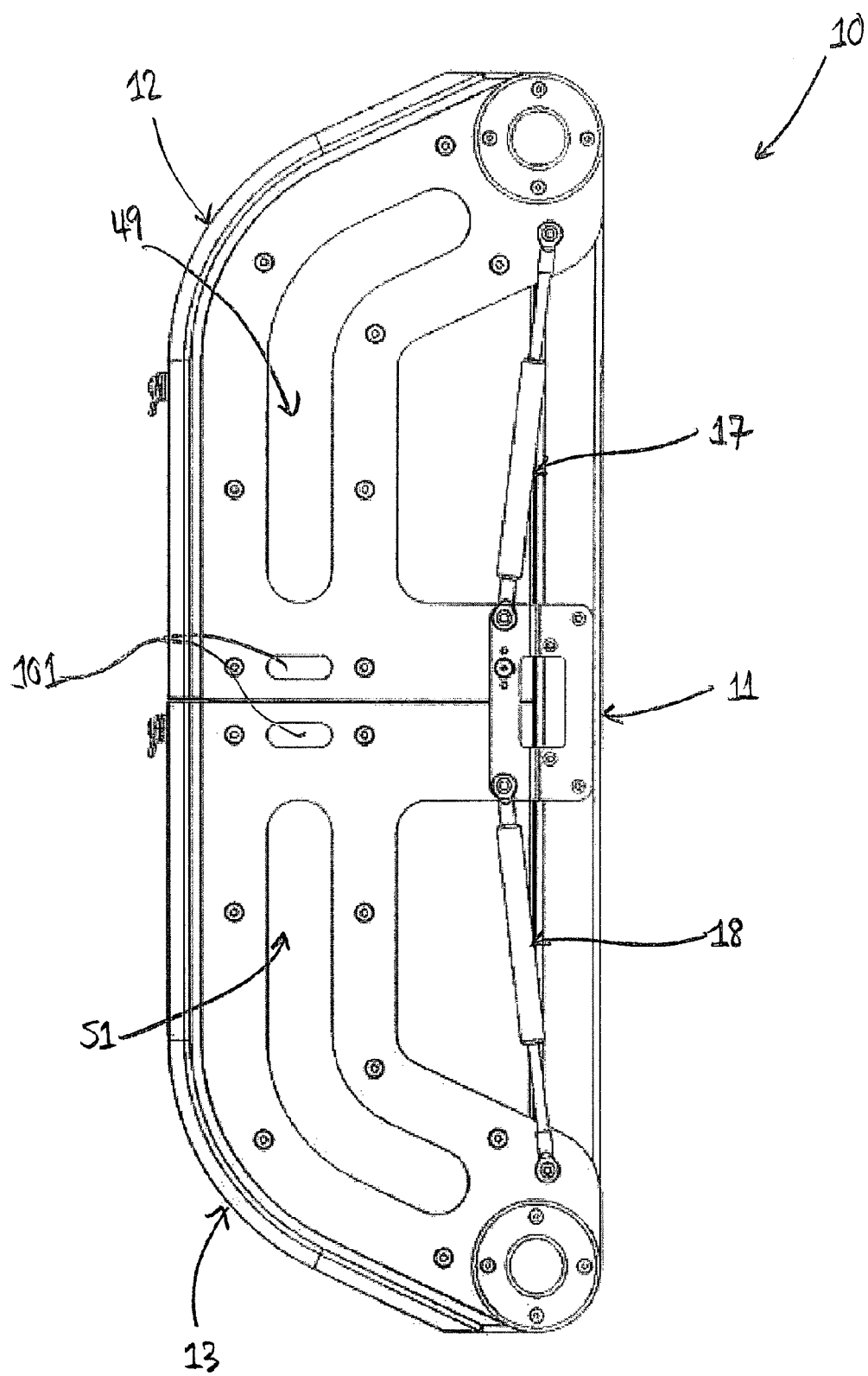
FIG. 4 shows a right-side view of the preferred embodiment storage unit.

The preferred embodiment storage unit is provided with windows on each side of the upper and lower doors 12, 13, although it will be appreciated that this is not essential. Referring to FIG. 4, the windows 49, 51 on the right-side of the upper and lower doors 12, 13 of the housing are shown. Identical windows 53, 55 on the left-side of the housing can be seen in FIG. 3. The windows are preferably completely transparent or alternatively may be slightly tinted and may be made from glass, perspex, or any other suitable transparent material.

In the preferred embodiment, finger-grips 101 are provided on each side of the doors 12, 13 to assist the user to open and close the doors. In particular, the finger-grips 101 are in the form of elongate recesses provided in the side surfaces of the doors 12 and 13 towards the centre of the housing.

In the preferred embodiment, the storage unit 10 is provided with a temperature control system 150 for controlling the temperature within the housing or which is arranged to at least cool the internal environment within the housing as shown in FIG. 8. The temperature control system may comprise an external air conditioning system 151 that is arranged to connect to the unit to provide a flow of conditioned air for controlling one or more environmental parameters or conditions, such as temperature, humidity and the like, within the internal environment of the housing when closed and/or an integrated cooling system 152 within the housing that creates forced ventilation through the housing with ambient air from the external environment.

It will be appreciated that a system of electronic devices mounted in a confined space tends to generate a significant amount of heat that needs to be dissipated or controlled for the protection of the system. The temperature control system comprises a control system that obtains measurements of particular internal environment parameters from monitoring sensors 153 located within the housing. For example, temperature and humidity sensors are mounted within the housing and communicate measured temperature and humidity levels or data to the control system. In response to the measured temperature and/or humidity and any other parameters, the control system is arranged to operate the external air conditioning system 151 and/or integrated cooling system 152 to control and/or reduce the temperature. It will be appreciated that the control system of the air conditioning system may be pre-programmed to automatically maintain or provide particular conditions within the internal environment of the housing or alternatively the control system may be dynamically altered by a user via the user interface that may be arranged to interact with the control system of the air conditioning system. The user interface may also be arranged to provide readings and data relating to the real-time conditions within the housing as sensed by the monitoring sensors and may be arranged to allow direct manual control of the fans if desired.

Figure 5:
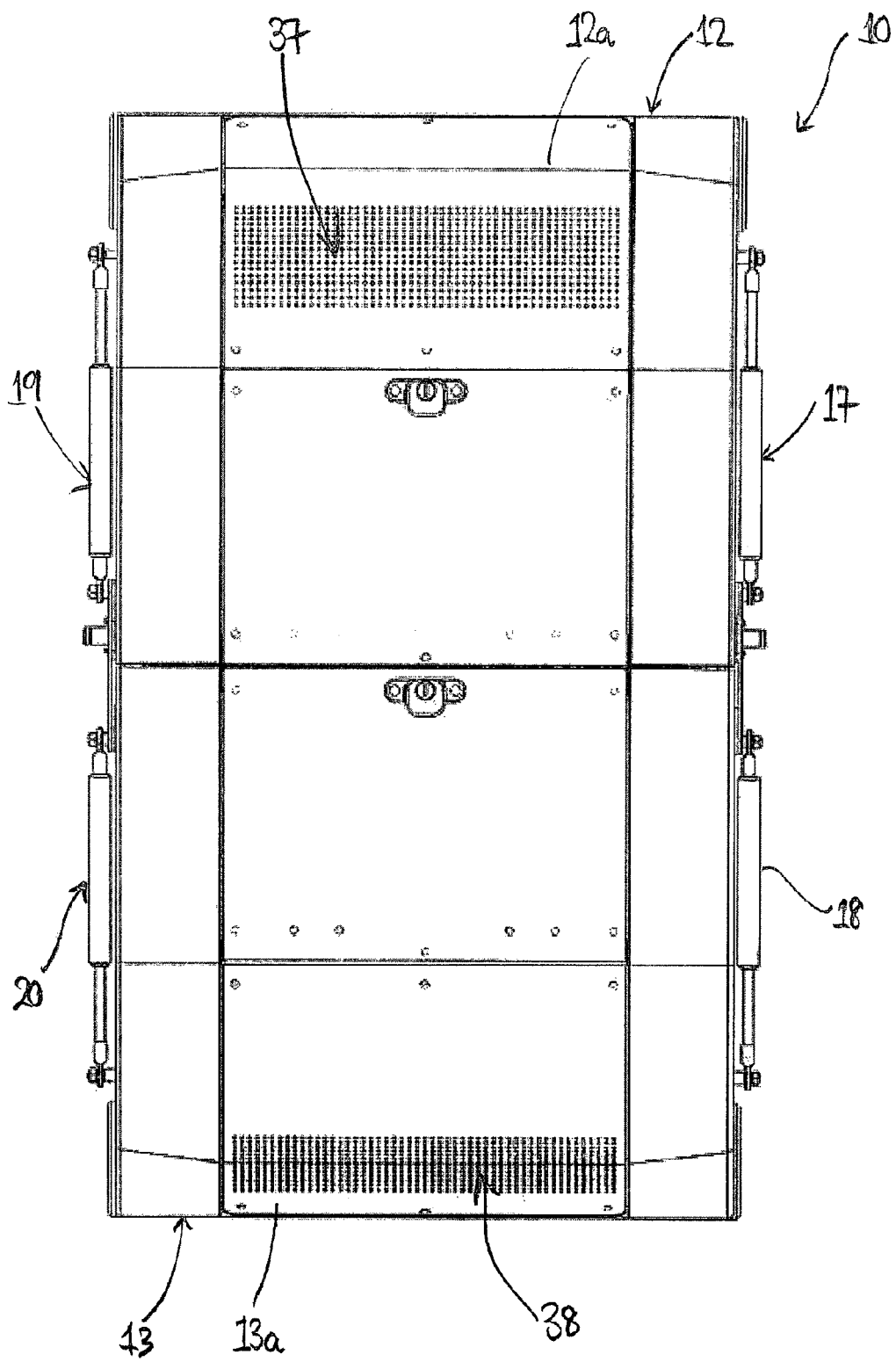
FIG. 5 shows a top view of the preferred embodiment storage unit.
Figure 6:
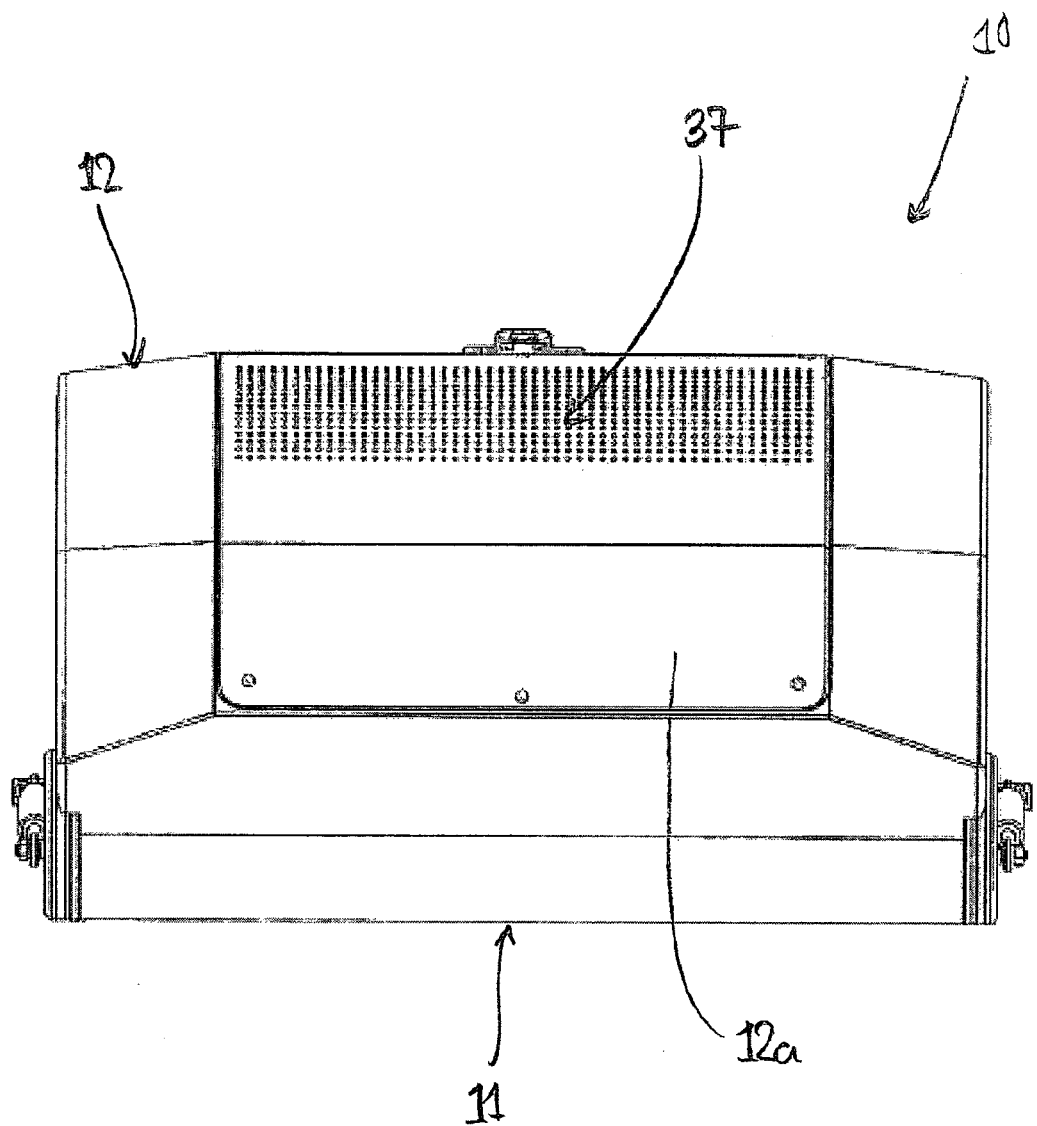
FIG. 6 shows a top end view of the preferred embodiment storage unit.
Figure 7:
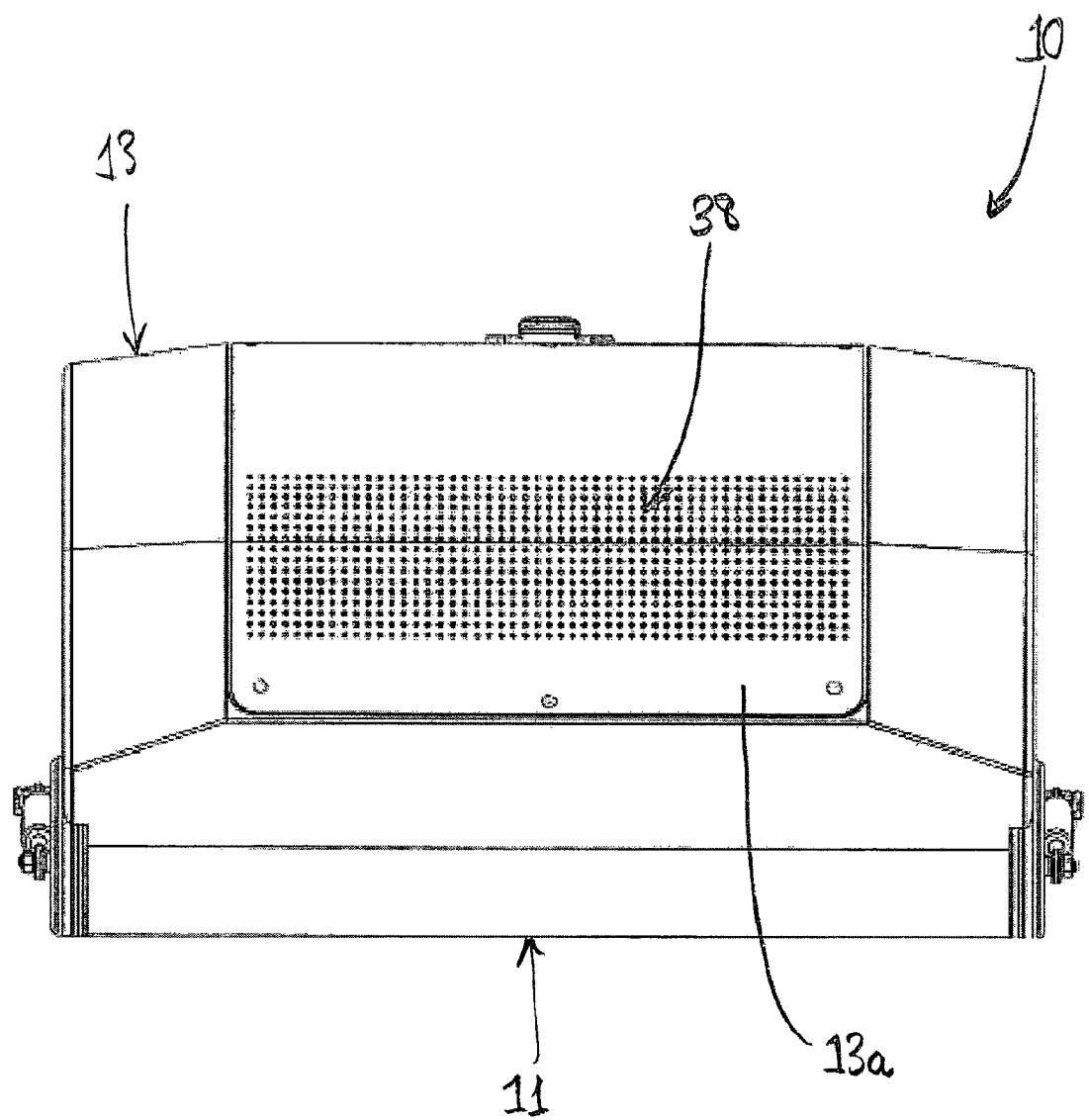
FIG. 7 shows a bottom end view of the preferred embodiment storage unit.

Referring to FIG. 8, in the preferred embodiment the integrated cooling system 152 comprises an arrangement of one or more operable fans to create air flows through the housing to control the conditions of the internal environment for the protection of the electronic devices situated within it. In particular, the operable fans have associated vents in the housing to the external environment and create air flows through the housing with ambient air from the external environment. As shown, the preferred embodiment integrated cooling system comprises an upper array of fans 35 mounted in the upper door 12 of the housing and a lower array of fans 36 mounted in the lower door 13 of the housing. With this arrangement, the upper array of fans 35 is arranged to blow air downward through the internal environment of the housing while the lower array of fans 36 is arranged to suck air from the housing. To ensure a downward draft or current of fresh air flow is provided, an upper inlet vent 37 associated with the upper array of fans 35 is provided in the upper door 12 of the housing as shown in FIGS. 5 and 6 to allow fresh air from the external environment to enter the housing. Similarly, a lower outlet vent 38 is provided in the lower door 13 of the housing to cooperate with the lower array of fans 36 as shown in FIGS. 5 and 7.

In the preferred embodiment, the vents 37, 38 in the doors 12, 13 are provided in the form of an array of small apertures or perforations formed in the front surfaces of the doors. It will be appreciated that the vents may alternatively be in the form of larger elongated slots or apertures with or without grill or mesh inserts. Further, the vents 37, 38 may be provided with air flow guide fins to direct the flow of air into or out of the housing in a desired direction. The unit may also be provided with removable dust filters between the fans and the vents to collect dust and other debris if desired.

The mounting system of the storage unit is arranged to receive and retain rack-mount electronic devices such that their heat dissipating ends are located toward the bottom end of the housing. Therefore, the preferred embodiment integrated cooling arrangement described above creates a downward flow of air from the inlet vent 37 through the housing and around the electronic devices retained by the mounting system to the outlet vent 38 that effectively transfers heat generated by the electronic devices out of the housing thereby operating as a cooling system. It will be appreciated that the speed of the operable fans 35, 36 may be controlled, either manually by the user interface or automatically by the control system, to alter the volume and intensity of the air flow through the housing to control the temperature of the internal environment and electronic devices as desired.

Figure 26:
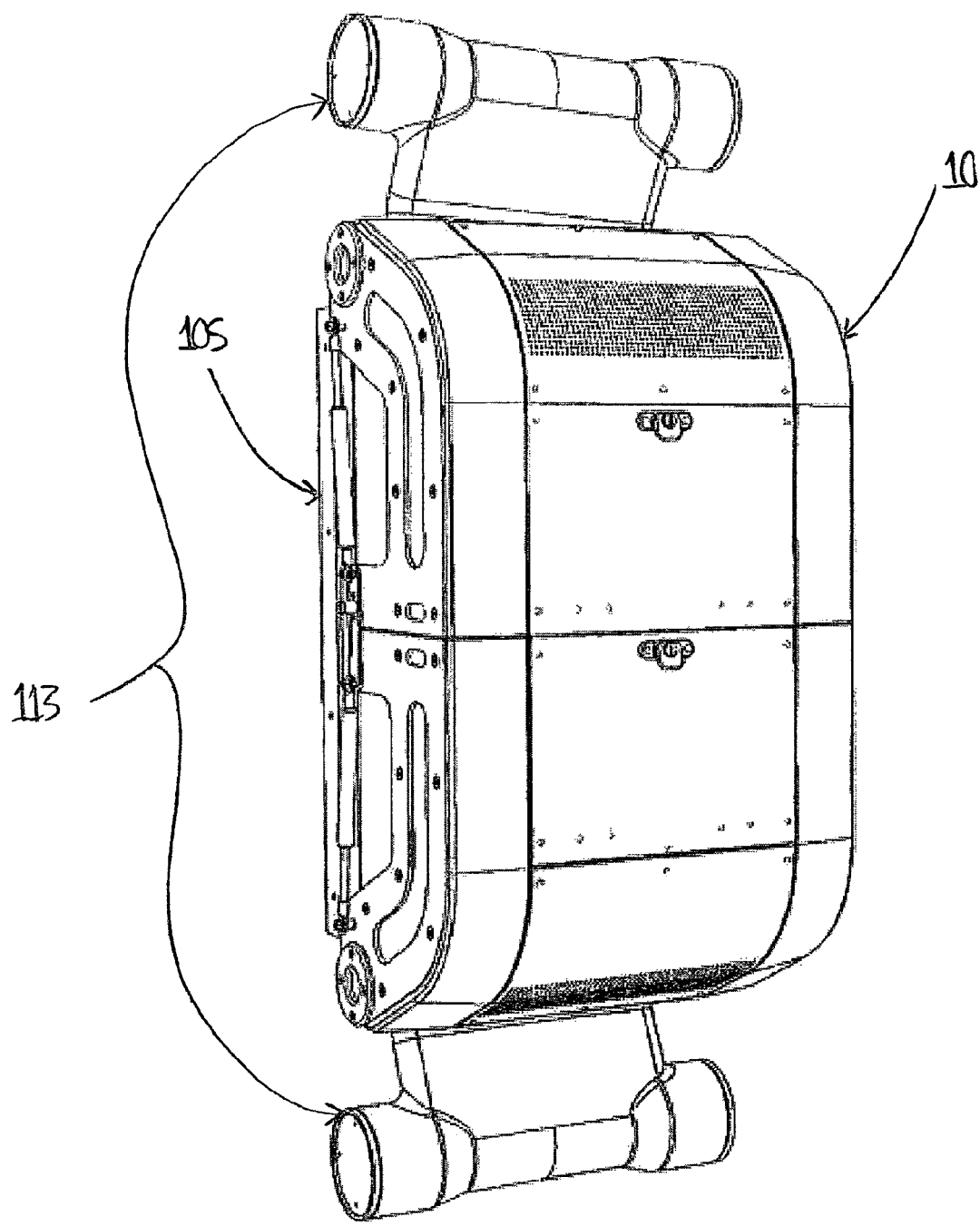
FIGS. 26 and 27 show front and rear perspective views respectively of the preferred embodiment storage unit being supported by a wall-mount bracket and with a manifold for air-conditioning ducting.
Figure 27:
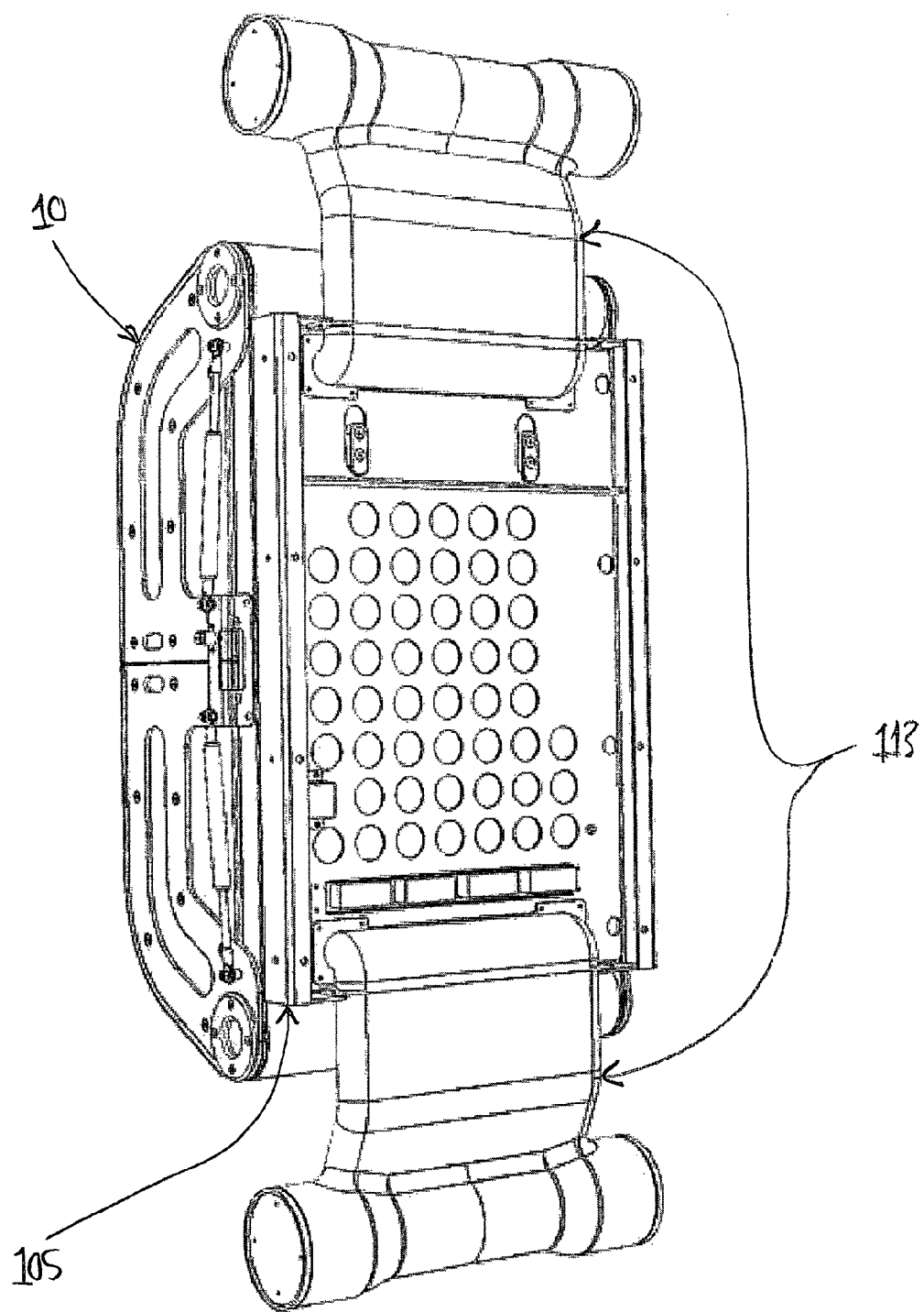

When the storage unit is located in a particularly harsh external environment, for example which is extremely hot and humid, a supplementary external air conditioning system may be coupled to the storage unit to actively control the conditions, such as temperature and humidity, within the housing. In the preferred embodiment, upper 58a and lower 58b slots or ports are provided in the base plate 11 of the housing to which a manifold may be fitted at the rear of the storage unit for attaching air-conditioning ducting for a supplementary external air conditioning system or unit as shown in FIGS. 1B and 8. An example of a manifold is shown in FIGS. 26 and 27 and this will be explained in more detail later with respect to these figures. For example, the external air conditioning unit may be arranged to introduce cooled air of a particular temperature and level of humidity into the internal environment. It will be appreciated that the external air conditioning unit may operate alongside the integrated cooling system described above or that it may operate completely independently if desired. When operating independently, the operable fans 35, 36 of the integrated cooling system may be disabled and the inlet and outlet vents 37, 38 may be fully or partially closed with covers to prevent harsh air from the external environment entering the housing.

It will be appreciated that the temperature control system may not be necessary for the storage unit depending on the electronic devices installed and operating in the unit. Further, different sized storage units will have different temperature control requirements. Some storage units may be provided with an integrated cooling system only, while others may also or alternatively connect to an external air conditioning system. It will also be appreciated that monitoring sensors arranged to sense and monitor the temperature and other parameters within the housing may or may not be required and the temperature control system can be customised for the specific requirements of different storage units if desired.

The preferred embodiment storage unit 10 may be mounted to a wall or any other vertical framework or surface, preferably in the vertical orientation shown in FIGS. 1A and 1B but alternatively it may be mounted in a horizontal or any other orientation as desired. When installing the storage unit 10, the base plate 11 may be fixed directly to the wall or the like via screw, nails, bolts, or any other fastening components. Alternatively, a separate mounting plate may be provided that may first be fixed to the wall or the like and which is arranged to securely receive and support the storage unit 10 via a releasable locking, hooking, or coupling arrangement. For example, the base plate 11 of the storage unit 10 may be arranged to be releasably engageable with the mounting plate.

It will be appreciated that the storage unit could alternatively by placed on the floor, in the bottom of a cupboard, in a cabinet, under a desk or in any other suitable area within a room or office or even outside if desired as the storage unit can be water-proofed. Various mounting arrangements and assemblies for the storage unit will be explained in more detail later with reference to FIGS. 22-25.

As mentioned, the preferred embodiment of the storage unit 10 is arranged to securely store and house a number of rack-mount electronic devices that may, for example, form part of a system, such as a computer server system or any other system that has a number of interconnected or interacting individual electronic components or modules. Typically, although not necessarily, some of the electronic devices retained within the storage unit 10 may need to be connected to other external devices via cables, wires and the like. For this purpose, a cable aperture 57 is provided toward the lower end of the base plate 11 of the housing through which cables or wiring looms may pass through from the electronic devices within the housing to external devices or the like.

A power source is required to drive the user interface and internal air conditioning system of the storage unit 10. Power may be provided to the user interface and internal conditioning system via a power cable or cables that pass through the cable aperture 57 of the base plate 11 of the housing or the storage unit may be provided with an integrated power cord that can be plugged into a power socket or the like. Alternatively, or additionally, the storage unit may be provided with an on-board rechargeable power supply for emergencies or when an external power source is not accessible.

It will be appreciated that the clam-shell housing of the preferred embodiment of the storage unit 10 is only one particular preferred design. Various other housing arrangements could alternatively be used. Any openable housing that can substantially enclose and protect the mounting system and the electronic devices it supports would be suitable. By way of example only, in an alternative form, the housing may comprise a base plate and a single enclosing door that pivots relative to the base plate to open and close the housing. In another alternative form, the housing may comprise a bin, box or other receptacle-type component that is enclosed by one or more doors or covers. In the preferred embodiment, the backing plate 11 and opposed openable doors 12, 13 of the housing are formed from plastic, but alternatively it will be appreciated that aluminum, metal or any other suitable material or combination of different materials may be utilised to construct the housing. Further, it will be appreciated that the doors 12, 13 may be formed as integral components or alternatively from multiple attached or interconnected components.

Referring to FIGS. 8-21, an example of the mounting system of the preferred embodiment storage unit 10 will now be described. The storage unit has a 6 U capacity in that it can accommodate one or more rack-mount electronic devices that together have a collective stacked height of 6 U or less. It will be appreciated that the mounting system and housing may be re-sized and altered to suit different capacities if desired, whether above or below 6 U.

At a broad level, the mounting system is arranged to receive and retain one or more electronic devices. In the preferred embodiment, the mounting system has a hinging assembly that is arranged to support at least one bracket, each bracket being arranged to receive and retain one or more electronic devices. The hinging assembly is arranged to allow the supported brackets to be moved relative to each other and the housing to provide individual access to each bracket for the installation, removal or maintenance of electronic devices. In some embodiments, part or all of the hinging assembly may also be arranged as a bracket or brackets to support one or more electronic devices directly without separate bracket components. With the direct support arrangement, the hinging assembly still provides the same effect in that the supported electronic devices may be moved relative to each other via the hinging assembly to provide access to each device as required. Therefore, the hinging assembly may be arranged to support, preferably in a cantilever fashion, one or more electronic devices, either directly or alternatively indirectly by supporting brackets that receive and retain the devices. It will be appreciated that part of the hinging assembly may provide for direct support while the remainder may be provided with brackets.

Figure 9:
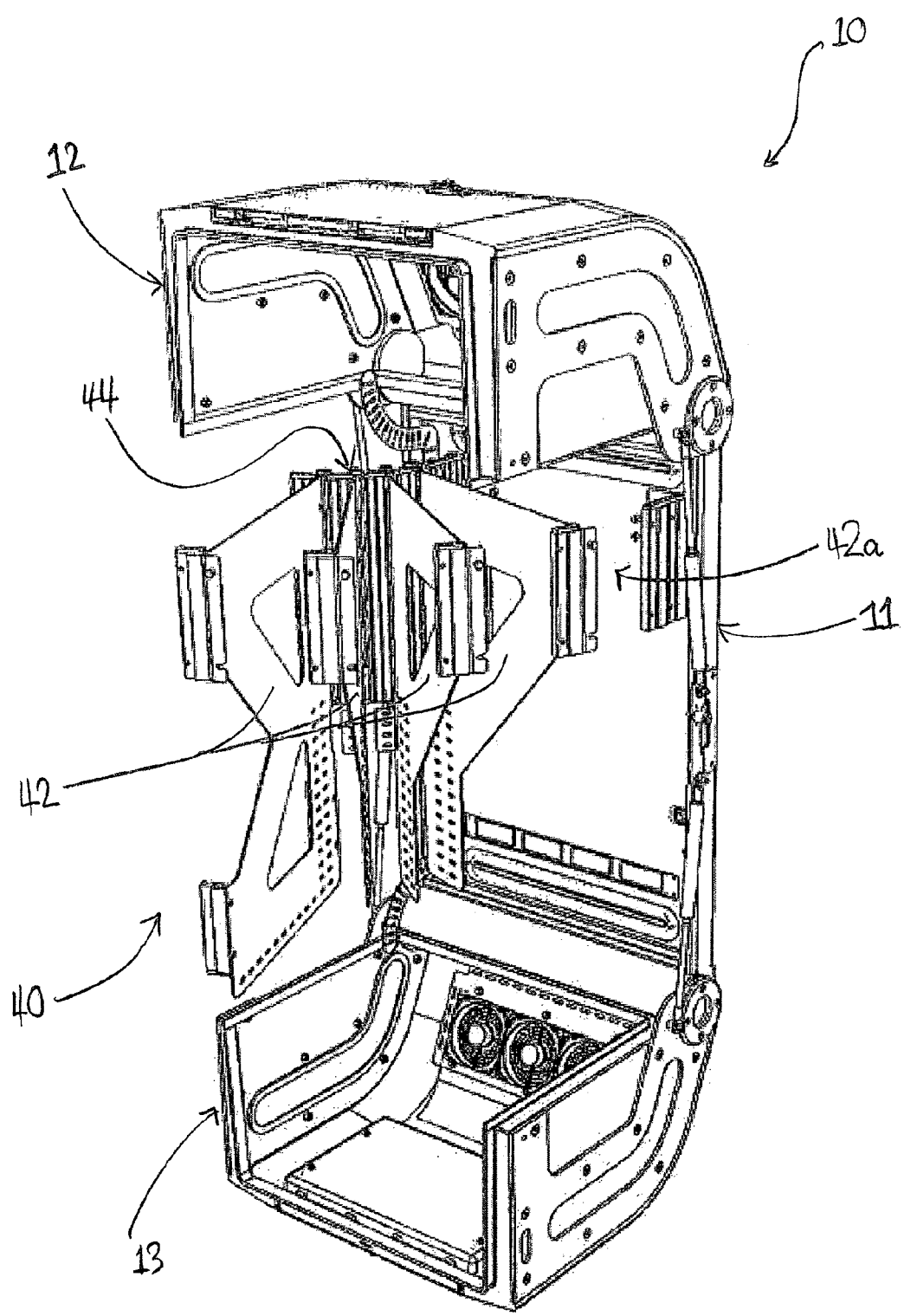
FIG. 9 shows a front right-side perspective view of the preferred embodiment storage unit of FIG. 8 showing the mounting system positioned in a fanned-out arrangement.

Referring to FIG. 8, the preferred embodiment mounting system 40 comprises an articulated hinging assembly 44 that is arranged to support a number of brackets 42. The brackets 42 and hinging assembly 44 will be described in more detail later. In general, each bracket 42 is arranged to securely receive and retain one or more rack-mount electronic devices. The hinging assembly 44 enables each bracket 42 to be individually accessible for the installation, removal or maintenance of electronic devices. In particular, the hinging assembly 44 allows the brackets 42 to be moved relative to each other and the housing. By way of example, FIG. 8 shows the brackets 42 folded-up together in a compact position in a side-by-side aligned arrangement ready for the housing to be closed. FIG. 9 shows the brackets 42 in a fanned-out position enabling all individual brackets to be accessed for the installation, removal or maintenance of electronic devices. In essence, the mounting system 40 operates like a book with the hinging assembly 44 representing the spine of the book and each bracket representing a page of the book. Therefore, the brackets may be brought together in closed compact arrangement like that shown in FIG. 8, opened up in a fanned-out arrangement like that shown in FIG. 9, or alternatively the brackets may be separated with respect to each other in a number of different arrangements. For example, some brackets may be separated from adjacent brackets, while other brackets in the mounting system may remain in a substantially abutting relationship. In particular, all brackets do not necessarily have to be fanned-out as shown in FIG. 9 to access one particular selected bracket. The bracket to be accessed may be individually accessed like opening a book to a particular page.

In the preferred embodiment, the mounting system 40 is modular in that it may be configured or customised by a user to accommodate for a particular system or collection of rack-mount electronic devices of various sizes. In particular, the hinging assembly 44 is arranged to releasably support modular brackets 42 that have different capacities and sizes. In terms of capacities, the modular brackets may, for example, be single brackets that are arranged to receive and retain one electronic device or dual brackets that are arranged to receive and retain two electronic devices, one toward the top of the bracket and the other toward the bottom of the bracket. In terms of size, the brackets may be configured to accommodate rack-mount electronic devices of any particular height, for example 1 U or any higher integral of U, the upper limit depending on the capacity of the storage unit.

Figure 10:
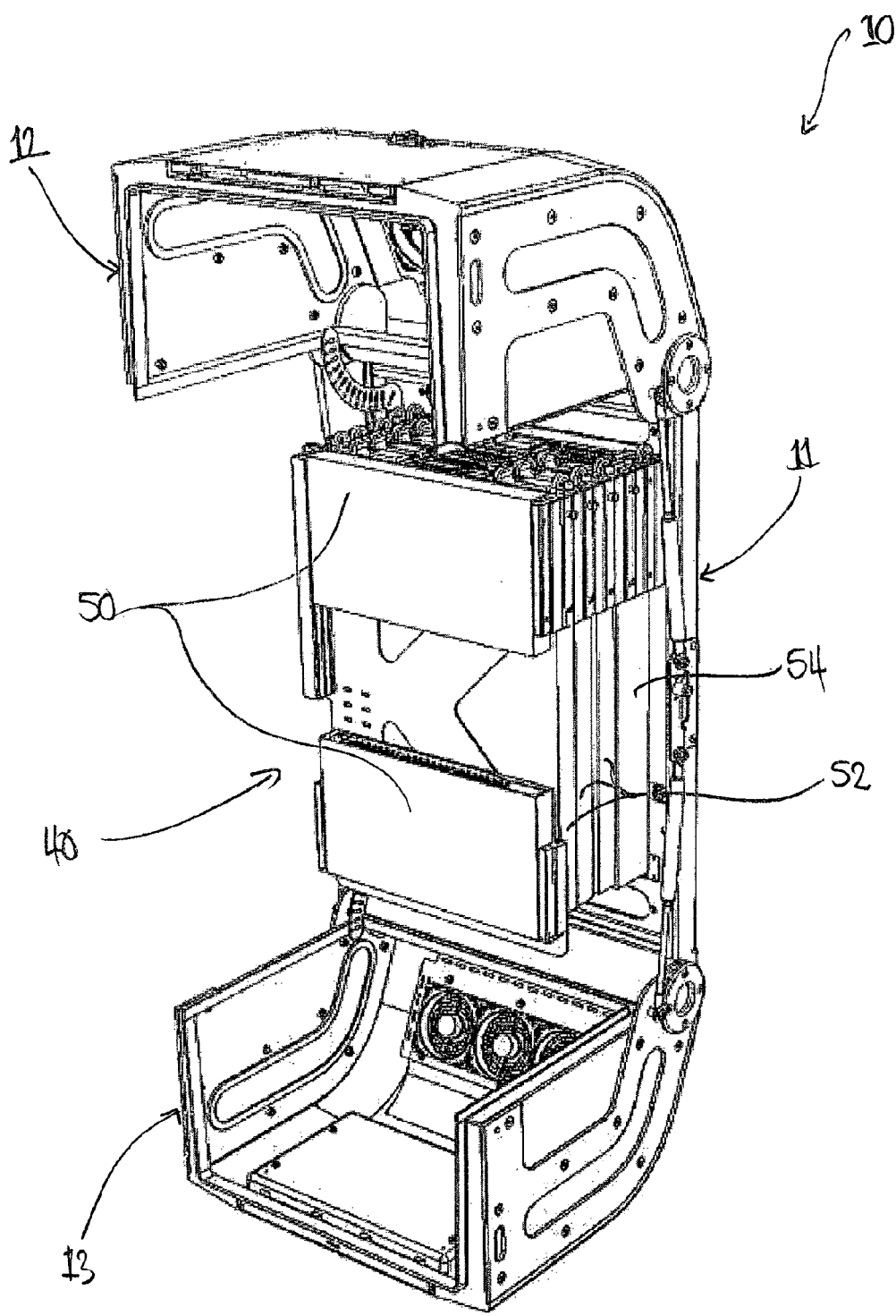
FIG. 10 shows a front right-side perspective view of the preferred embodiment storage unit with the doors in an open position and a number of electronic devices securely retained by the mounting system.

By way of example, the preferred embodiment storage unit 10 is configured with four modular brackets 42 and one hybrid bracket 42a that provides for direction support of an electronic device by the hinging assembly but which also cooperates with the base plate 11 and partial bracket components fixed to the base plate. Referring to FIG. 10, the first bracket is a 1 U dual bracket that is arranged to securely receive and retain two rack-mount electronic devices 50 that are half length pieces of equipment of height 1 U. For example, the devices 50 may be networking equipment such as communications routers and/or LAN switches. The next three brackets are 1 U single brackets that are each arranged to securely receive and retain one electronic device 52 of height 1 U, for example a full length piece of equipment such as a server or an Uninterruptible Power Supply (UPS). The fifth and last hybrid bracket 42a is a 2 U single bracket that is arranged to receive and retain a rack-mount electronic device 54 of height 2 U, for example a full length piece of equipment such as a server or UPS. It will be appreciated that a 2 U single bracket may be provided anywhere on the hinging assembly 44 and that there may be more than one 2 U single bracket. Typically, for a computer networking system, the UPS (1 U or 2 U) is preferably mounted at the back of the storage unit 10 adjacent the base plate 11 due to its greater weight relative to the other electronic devices of the system. As mentioned, the capacity of the preferred embodiment storage unit 10 is 6 U. In particular, the mounting system may accommodate any combination of one or more brackets, of varying capacity (single or dual) and sizes (in Us), provided the total collective number of Us of the brackets is less than or equal to 6 if the unit is configured for 6 U capacity. As mentioned, the capacity may be altered or customised as desired.

As mentioned, the mounting system may be customised by the user to suit a particular electronic system or for storing a particular set of rack-mount components. There are a larger number of combinations of different bracket arrangements. For example, the preferred embodiment storage unit 10 could accommodate, one single 6 U bracket, three 2 U brackets, two 2 U brackets and two 1 U brackets, six 1 U brackets, or any other combination of brackets between 1 U and 6 U in size in whatever order from front to back relative to the housing. Further the capacity of each bracket may be varied between single and dual type brackets. It will also be appreciated that the 6 U capacity need not necessarily be fully occupied by brackets and that brackets may be swapped from one position to the other on the hinging assembly of the mounting system.

It will be appreciated that the storage unit may alternatively come with a non-modular mounting system. In particular, the storage unit may be provided with a pre-arranged set or range of brackets that are permanently attached to the hinging assembly. By way of example only, the set may comprise a combination of single and dual brackets of varying sizes that may suit particular electronic systems that are known to typically have a particular number of components of a particular size. Alternatively, the mounting system may be provided with no brackets, such that electronic devices need to be directly connected or secured to the hinging assembly.

The modular mounting system 40 of the preferred embodiment storage unit 10 will now be described in more detail with reference to FIGS. 11-19. The hinging assembly 44 preferably comprises a chain of six adjacent hinging components 60 that are interconnected for hinged movement relative to each other. The chain of hinging components 60 is preferably fixed to or within the housing, for example to the base plate 11, via a rear mounting plate 99 that is pivotally coupled to one of the hinging components that is on the end of the chain. In the preferred embodiment, the hinging components 60 are elongate with a width that is approximately equal to 1 U (1.75 inches or 44.45 mm) and the number of hinging components effectively dictates the overall capacity of the storage unit. For example, in the preferred embodiment storage unit there are six hinging components that together provide 6 U capacity. Altering the capacity of the unit can be achieved by adding or removing hinging components from the chain.

Figure 14:
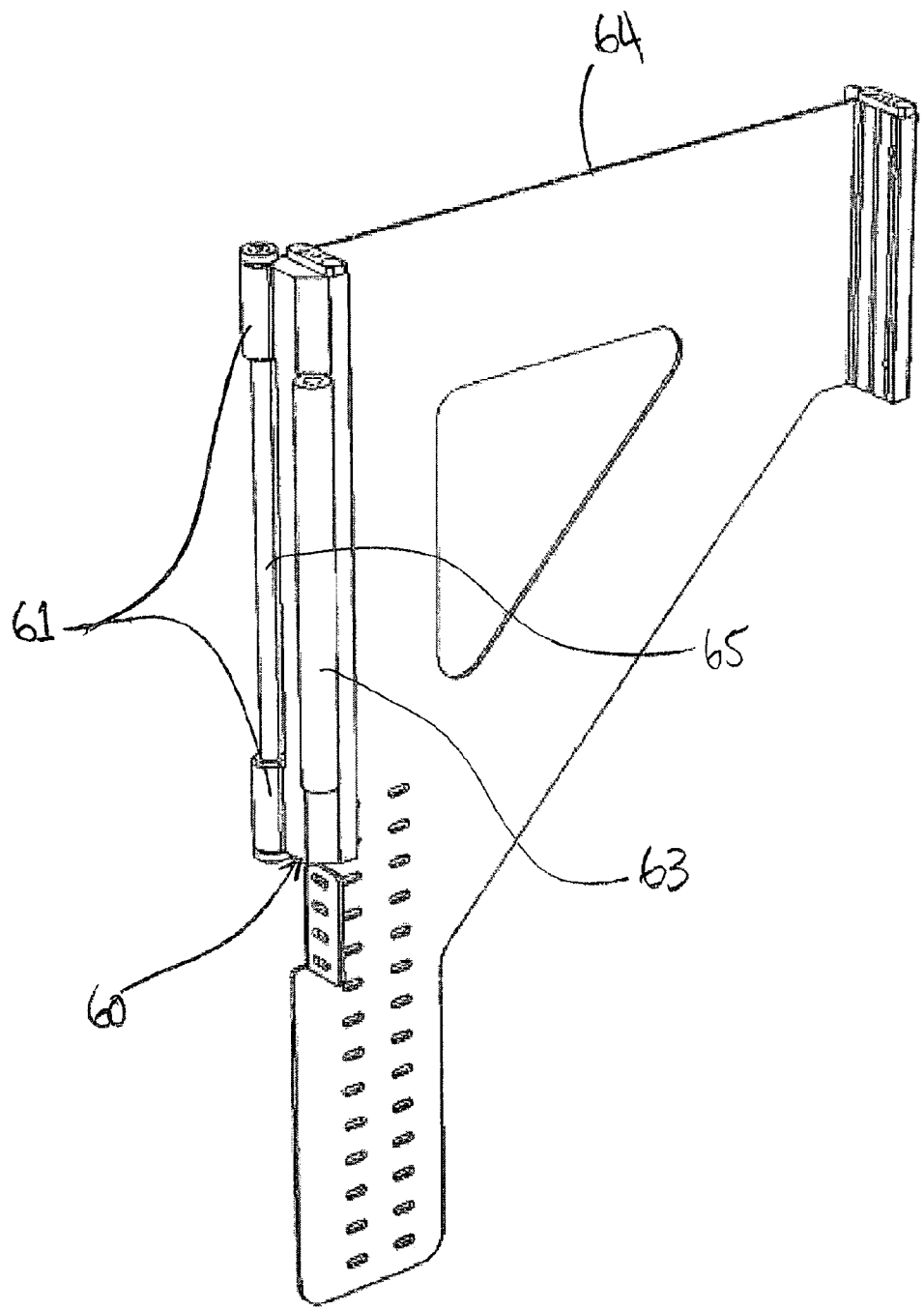
FIG. 14 shows a rear perspective view of a hinging component of the hinging assembly that is supporting a 1 U single bracket.
Figure 15:
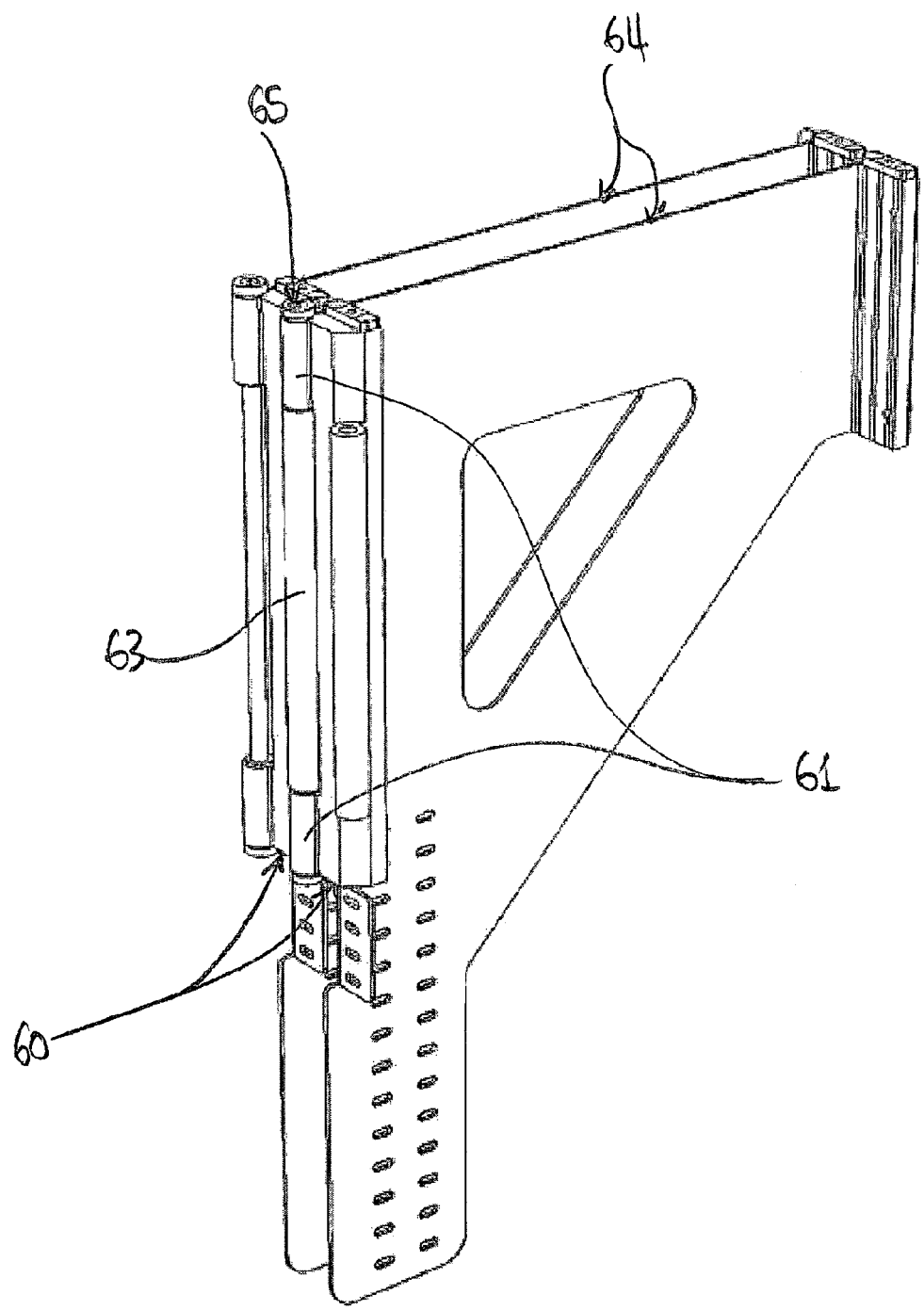
FIG. 15 shows a rear perspective view of the pivotal coupling arrangement that connects two adjacent hinging components of the hinging assembly, each hinging component shown supporting a 1 U single bracket.

Referring to FIGS. 14 and 15, each of the hinging components 60 is provided with elongate loops 61, 63 on either side that cooperate with complementary elongate loops of adjacent hinging components to allow for rotation or pivotal movement about the vertical pivot axis provided by a common interlocking pivot rod 65 or the like. In particular, each of the hinging components 60 comprise upper and lower elongate loops 61 or cylinders on one side and a central elongate loop 63 or cylinder on the other side. FIG. 15 shows, by way of example, two hinging components 60 pivotally coupled together for relative pivotal movement by their complementary elongate loops 61, 63 that are operatively connected via common pivot rod 65 that forms a pivot axis for the movement. In particular, the upper and lower elongate loops 61 of the front hinging component are aligned with the central elongate loop 63 of the rear hinging component such that the hinging components can be operatively connected via a pivot rod 65 that extends through the aligned elongate loops 61, 63. The hinging components 60 are shown, by way of example, supporting 1 U single brackets 64.

In the preferred embodiment, each of the hinging components 60 is arranged to support, in a cantilever fashion, a modular bracket either alone or in combination or cooperation with one or more adjacent hinging components. In particular, each hinging component 60 is capable of releasbly supporting a 1 U bracket, whether single or dual. For larger brackets above 1 U in size, two or more adjacent hinging components are required. In particular, larger brackets are arranged to be supported by a number of adjacent hinging components, the number being equal to the integer U size of the bracket. For example, 2 U brackets are supported by two adjacent hinging components, 3 U brackets are supported by three adjacent hinging components, and so on. The adjacent hinging components that support such larger brackets effectively operate as or collectively form a single larger hinging component as each of the individual adjacent hinging components that form the larger hinging component cannot move relative to each other when supporting the larger bracket. As mentioned, the hinging components, alone or in cooperation with one or more adjacent hinging components, can also be arranged to directly support, in a cantilever fashion, the electronic devices of different sizes without brackets if desired.

In the preferred embodiment, the hinging components 60 of the hinging assembly 44 are arranged to rigidly, but releasbly, couple to an attachment part of a bracket, either alone or in combination with one or more adjacent hinging components. In particular, the hinging components support the bracket or brackets in a cantilever fashion. The supported brackets may pivot relative to each other, like the pages of a book as described above, by virtue of the hinged or pivotal interconnection between adjacent hinging components.

The hinging components 60 of the hinging assembly 44 are substantially identical and are capable of supporting various different arrangements of modular brackets of varying size and capacity as mentioned. It will be appreciated that a user may interchange or mix and match the brackets on the hinging assembly as desired to customise the storage unit for their particular system or collection of electronic devices. As mentioned above with reference to FIG. 10, the storage unit 10 is shown with one particular arrangement of five brackets (four modular 42 and one hybrid 42a) by way of example only. The mounting system 40 will be described further by way of example with reference to that arrangement and FIGS. 11-19. As mentioned, the first modular bracket 62 is a 1 U dual bracket, the next three modular brackets 64 are 1 U single brackets, and the fifth hybrid bracket 66 is a 2 U single bracket.

Figure 16:
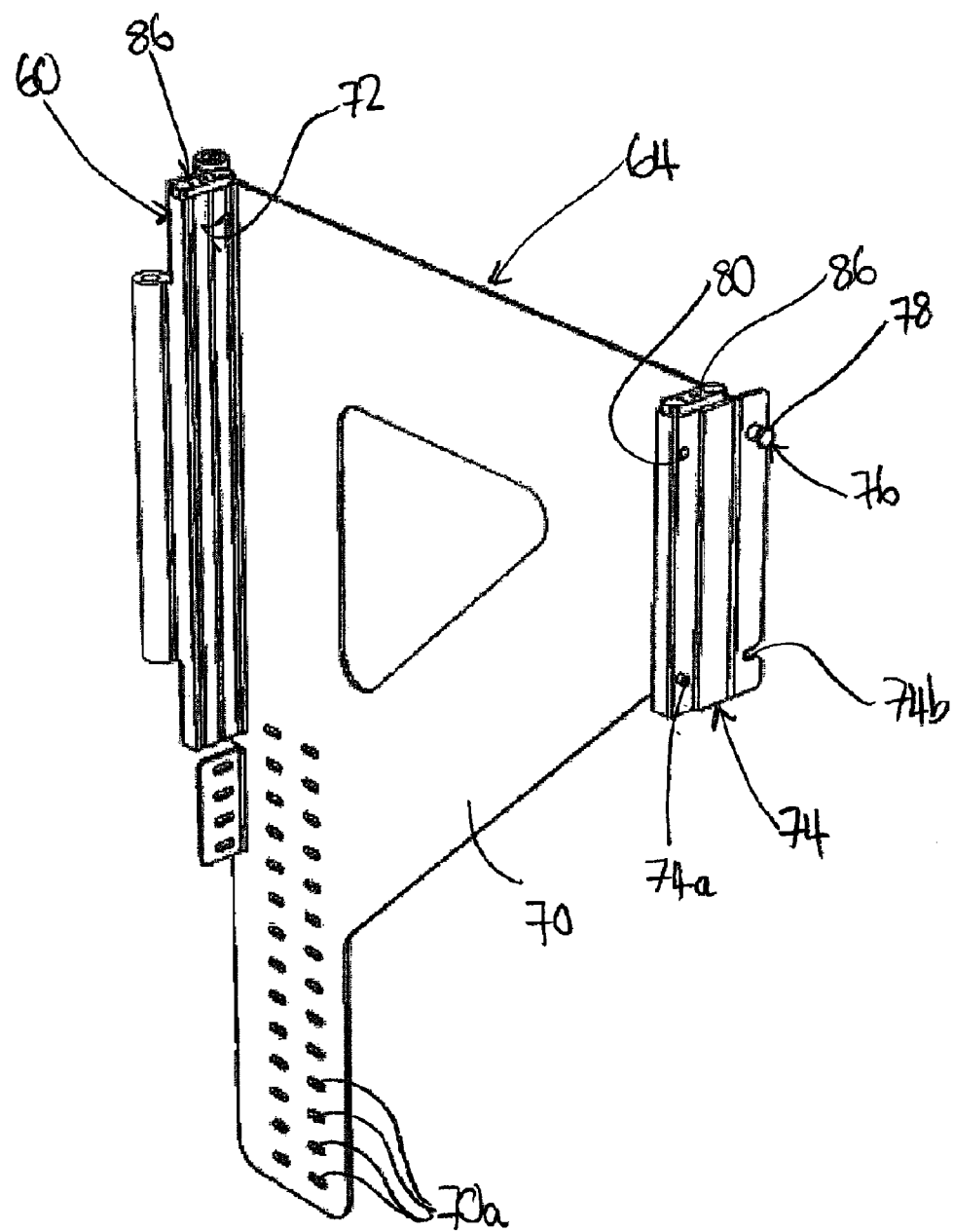
FIG. 16 shows a front perspective view of a 1 U single bracket supported by a hinging component.
Figure 17:
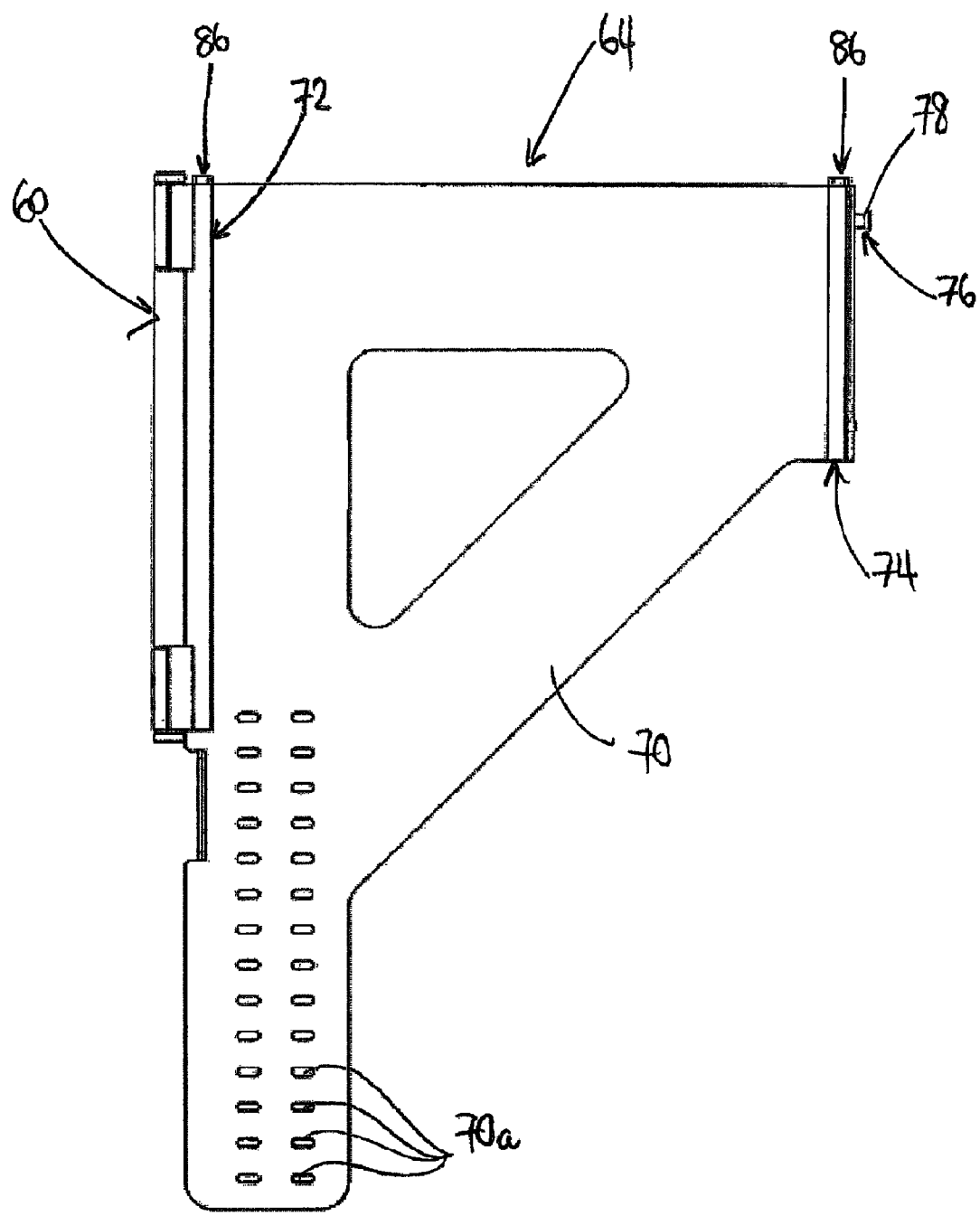
FIG. 17 shows a side elevation view of the 1 U single bracket of FIG. 16.

Referring to FIGS. 16 and 17, the 1 U single brackets 64 preferably comprise a backing plate 70 that is provided with a rear end guide 72 and a front end guide 74. The rear end guide 72 is arranged to securely engage with one of the hinging components 60 of the hinging assembly. For example, the rear end guide 72 of the 1 U single brackets 64 are arranged to slide down into engagement with a complementary part of a single hinging component 60 thereby leaving the bracket supported by the hinging component in a cantilever fashion. In this respect, the rear end guide 72 may perform the function of a sleeve around the hinging component 60.

The front end guide 74 is preferably provided with a manually operable locking mechanism 76 that is operable to lock the bracket to an adjacent bracket. In the preferred embodiment, the locking mechanism 76 comprises a spring-loaded locking pin 78 that is engageable with a locking aperture 80 of the locking mechanism of an adjacent bracket. Once adjacent brackets are locked together via their locking mechanisms, they cannot be moved relative to each other via the hinging assembly until the appropriate locking mechanism is unlocked via manual operation of the locking-pin 78. Each front end guide 74 is also preferably provided with a guide pin 74a protruding outwardly for engagement into a complementary guide slot 74b of an adjacent bracket to assist the alignment and coupling of the brackets together.

Figure 20:
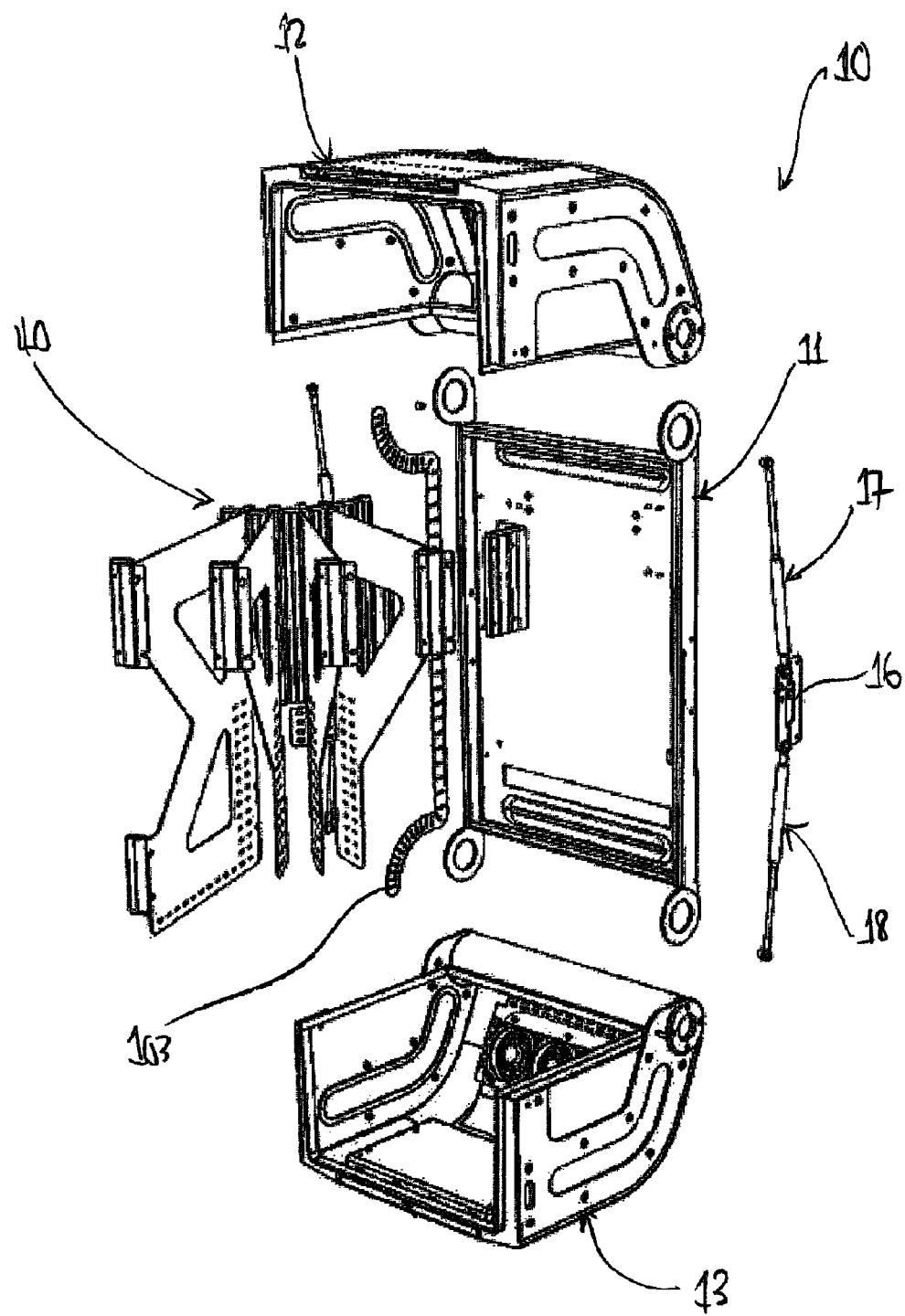
FIG. 20 shows a partially exploded front right-side perspective view of the preferred embodiment storage unit.

The backing plates 70 of the 1 U single brackets 64 preferably comprise a series of cable management apertures 70a through which cable ties may be secured in order to fasten and guide cables connected into the mounted electronic devices of that bracket as desired. Referring to FIGS. 8 and 20, a cable management bar 103 having a series of apertures along its length is also provided behind the hinging assembly 44 to enable the cables to be guided and secured neatly within the unit as desired.

The rear end guide 72 and front end guide 76 of the 1 U single brackets 64 are arranged to guide a rack-mount electronic device into place within the bracket. The distance between the rear and front guides 72, 74 is approximately 17.75 inches (450.85 mm) to accommodate the standard 19-inch rack-mount electronic components. The overall length of the 1 U single brackets 64 is approximately 465 mm and the depth is approximately 1 U. In operation, a user installs a rack-mount electronic device into the bracket by placing the device against the backing plate 70 of the bracket and in between the guides 72, 74 or alternatively sliding the device down against the backing plate 70 between the guides 72, 74 until it comes to rest into in a securely retained position within the bracket where tabs on the front panel of the device can be fixed with bolts or other fastening components to a pattern of mounting apertures or threaded holes provided on the top ends 86 of the guides 72, 74. To remove the electronic device from the bracket requires a reversal of the above process. It will be appreciated that the guides could alternatively be provided with securing rails or flanges that enable the electronic device to slide into a secure engagement with the bracket without the need for fastening components such as bolts or the like. It will be appreciated that various other bracket designs could be utilised to receive and securely retain a rack-mount electronic device in alternative forms of the mounting system. For example, the brackets could be arranged to receive and retain electronic devices via snap-fit or friction-fit type arrangements.

Figure 18:
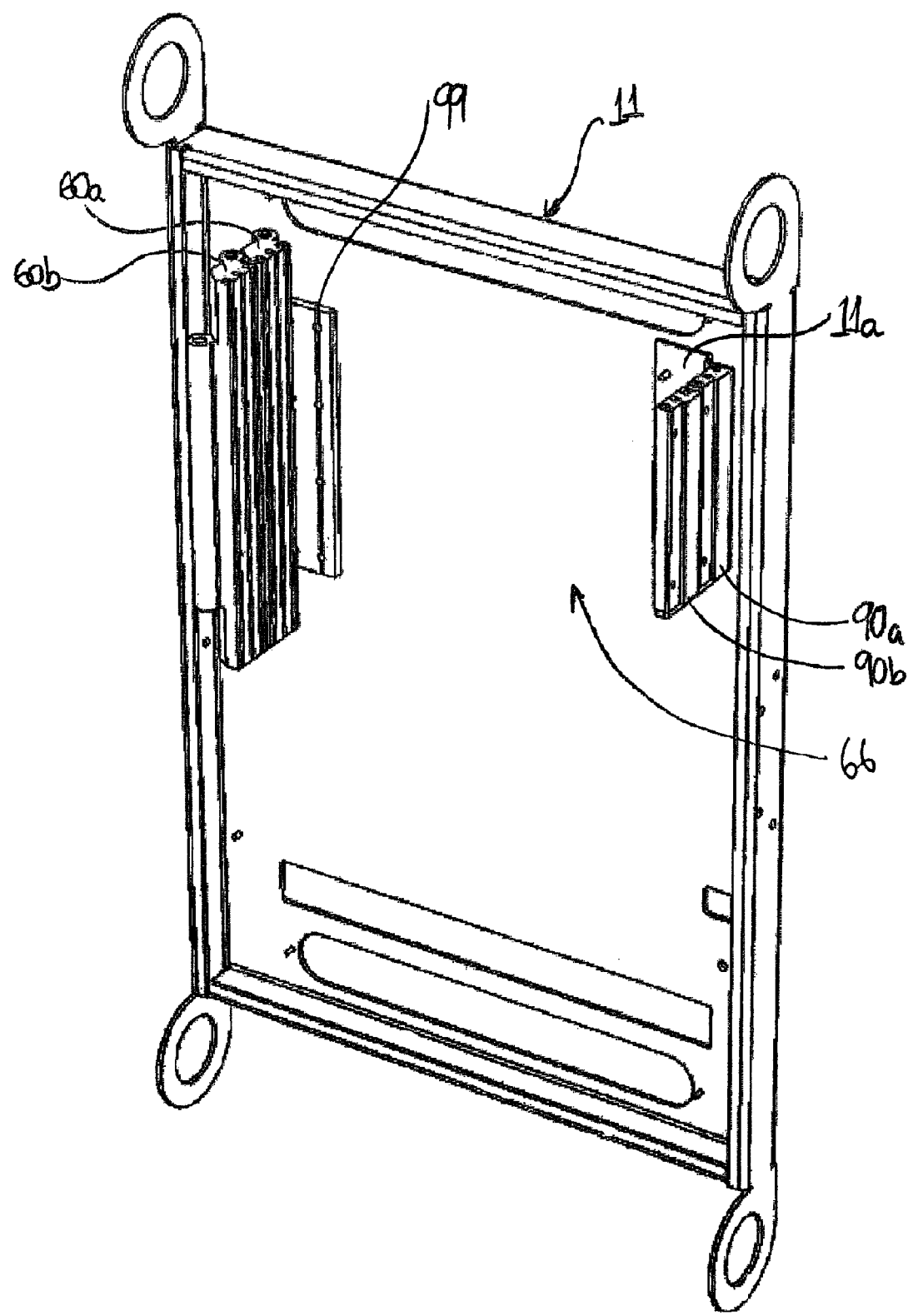
FIG. 18 shows a front perspective view of a 2 U single bracket formed by two adjacent hinging components.

Referring to FIG. 18, the 2 U single hybrid bracket 66 of the preferred embodiment storage unit is shown. The hybrid bracket 66 is formed between two adjacent hinging components 60a, 60b, the base plate 11 of the housing and two adjacent front end guides 90a, 90b that are fixed to the base plate 11. Each front end guide 90a, 90b is substantially identical to the front end guide 74 described in respect of the 1 U single bracket of FIGS. 16 and 17. The front end guides 90a and 90b are locked together via the same locking mechanism 76 as described in respect of the front end guide 74 of the 1 U single bracket. In the preferred embodiment, the front end guide 90a is arranged to lock via its locking mechanism with a front mounting plate 11a fixed to the base plate 11. In particular, the front mounting plate 11a is provided with a locking aperture into which the locking mechanism may engage. In the preferred embodiment, the rear mounting plate is 99 is fixed to the base plate 11 and is provided with a central elongate cylinder for engaging with the rear upper and lower elongate loops 61 of the hinging component 60a via a locking pin to enable pivotal movement of the 2 U electronic device installed in the hybrid bracket. In operation, a user can install a 2 U rack-mount electronic device into the hybrid bracket 66 by sliding the device down in between the two adjacent hinging components 60a, 60b and the front end guides 90a, 90b until the tabs on the front panel of device come to rest on top of the hinging components 60a, 60b and front end guides 90a, 90b. At this point, the 2 U device can be fixed in place with bolts or other fastening components to a pattern of mounting apertures or threaded holes provided on the top ends of the hinging components 60a, 60b and front end guides 90a, 90b. In this arrangement, the hinging components 60a, 60b are directly supporting the 2 U device with the assistance of the hybrid bracket configuration formed by the base plate 11 and the modular front end guides 90a, 90b.

Figure 19:
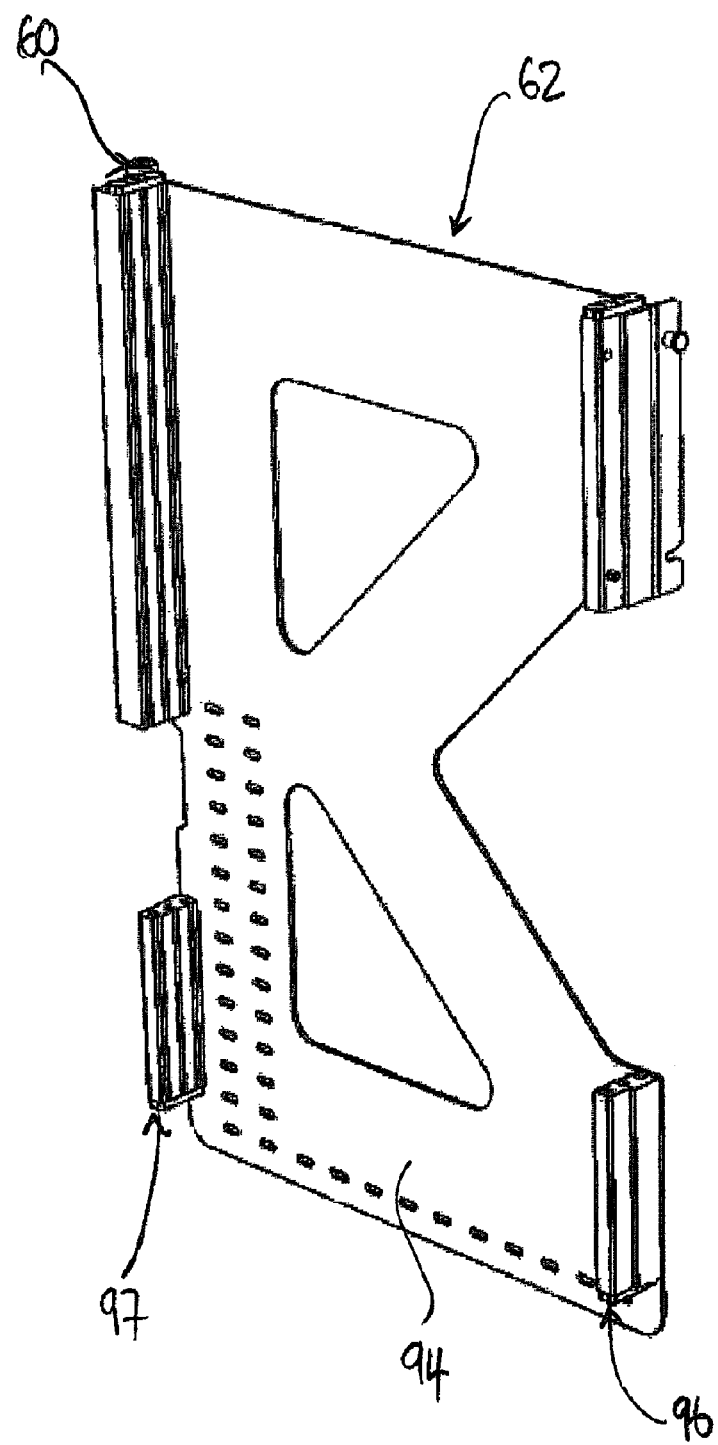
FIG. 19 shows a front perspective view of a 1 U dual bracket supported by a hinging component.

Referring to FIG. 19, the dual 1 U brackets 62 are also substantially similar to that of the 1 U single brackets 64, except they are provided with a larger backing plate 94 and additional lower front 96 and rear 97 guides so that they can securely receive and retain two half length rack-mount electronic devices, one above the other.

Figure 11:
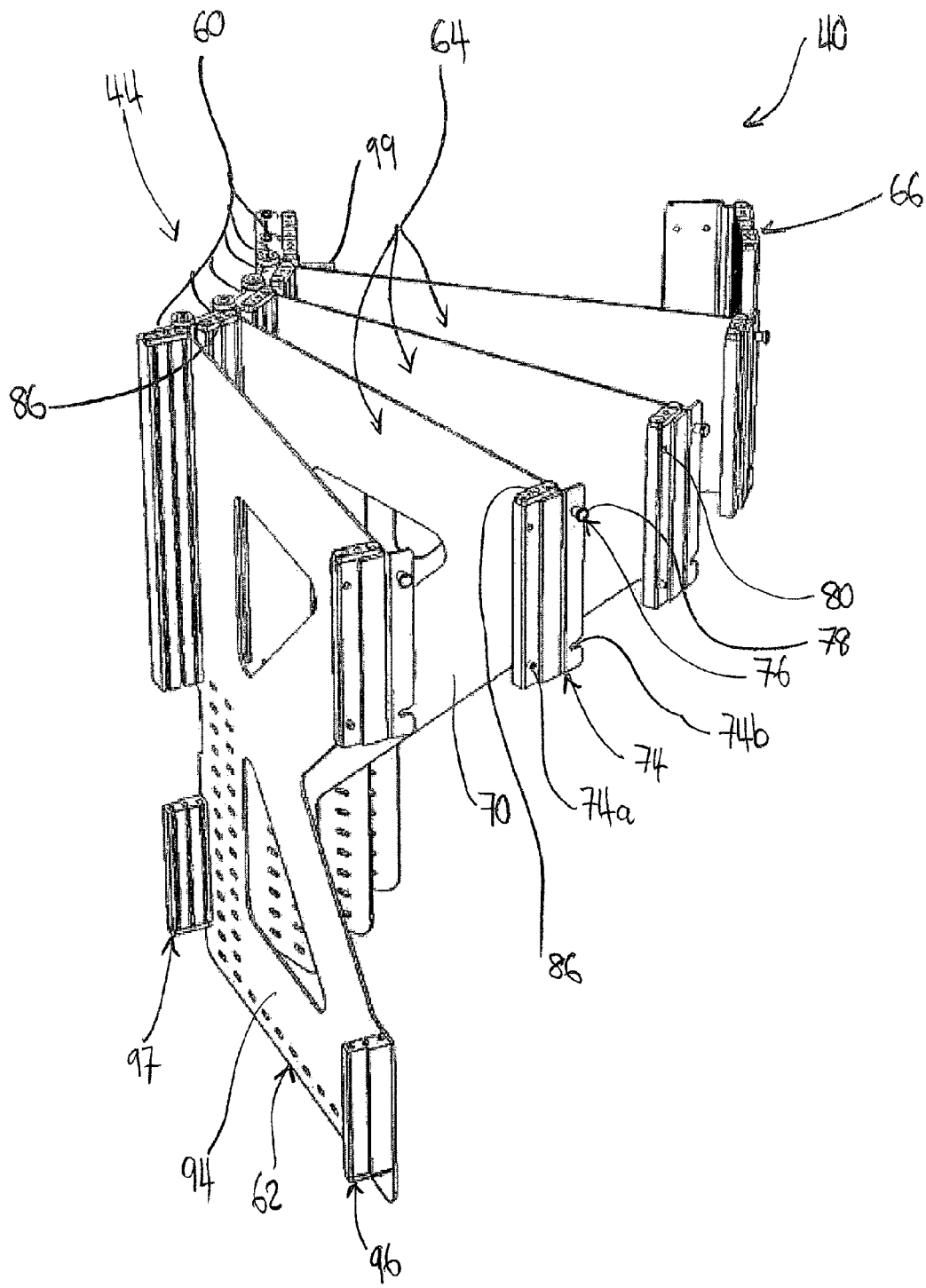
FIG. 11 shows a front perspective view of the mounting system of the preferred embodiment storage unit in its own right, empty, and positioned in a fanned-out arrangement.
Figure 12:
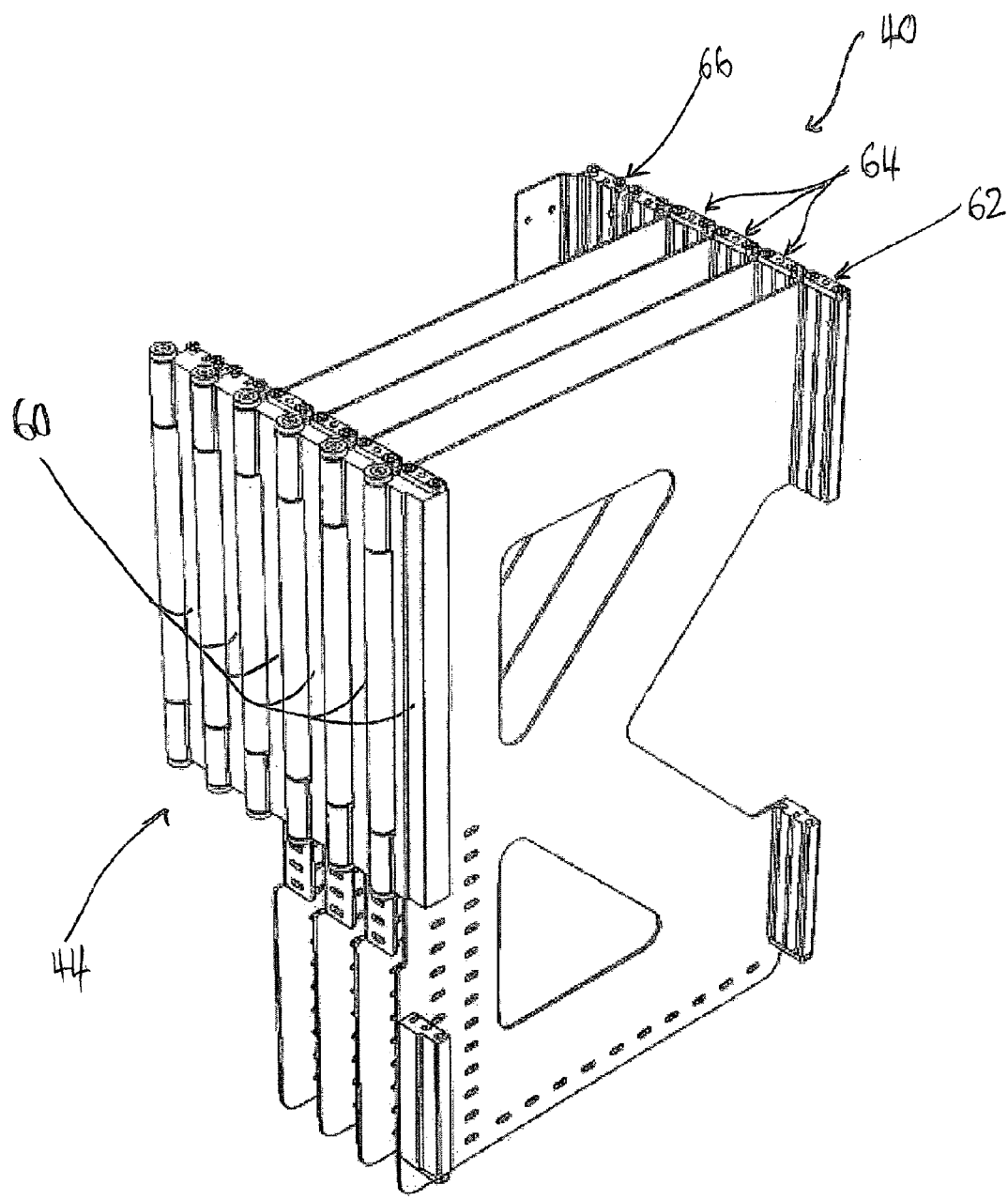
FIG. 12 shows a rear perspective view of the mounting system of the preferred embodiment storage unit in its own right, empty, and positioned in a compact arrangement.
Figure 13:
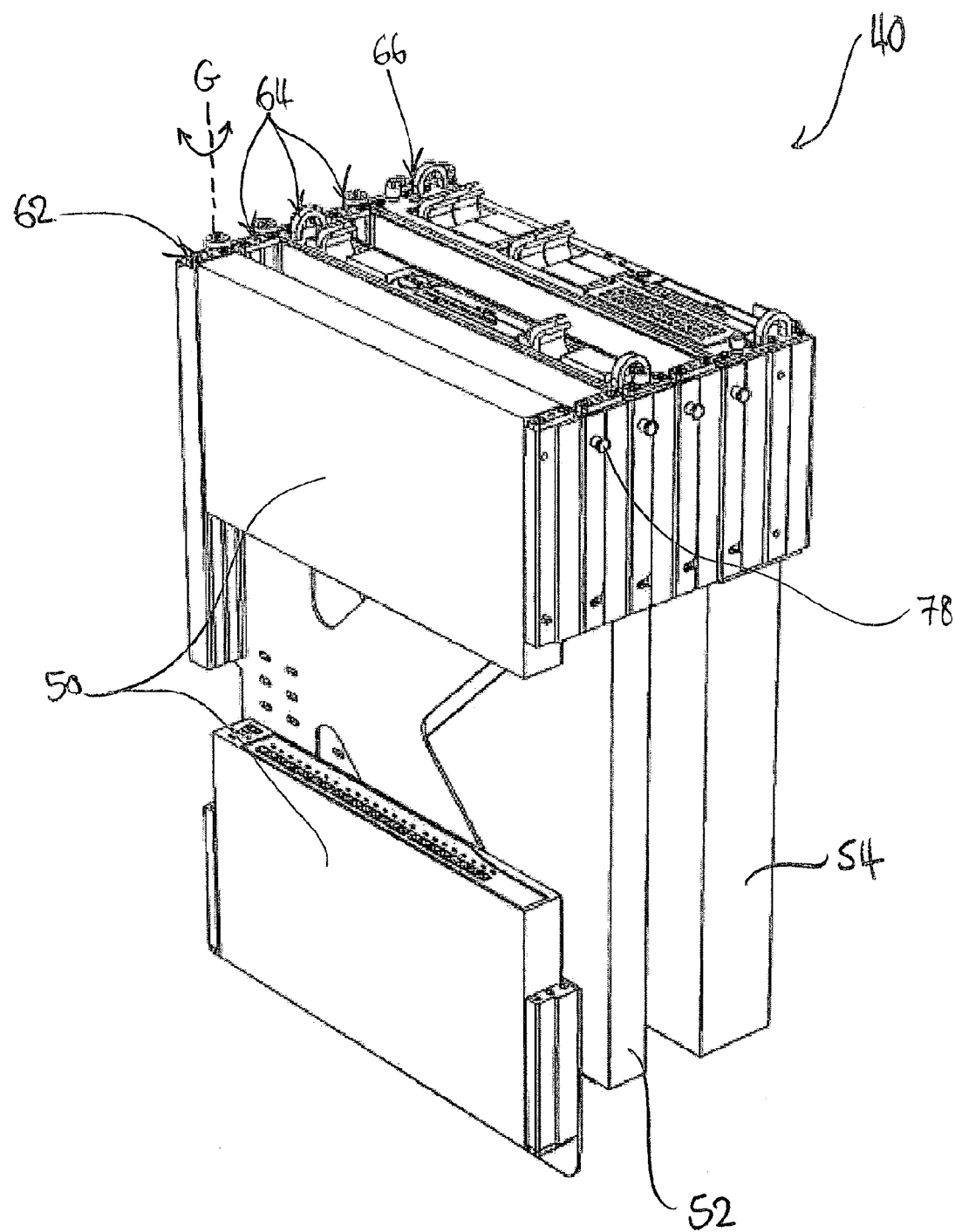
FIG. 13 shows a front perspective view of the mounting system of the preferred embodiment storage unit in its own right and positioned in a compact arrangement retaining a number of electronic devices.

FIG. 11 shows the mounting system 40 in a fanned-out arrangement in which all brackets are separated from or pivoted relative to each other. In this fanned-out arrangement, the chain of hinging components 60 is substantially arc-shaped. Referring to FIGS. 12 and 13, the mounting system 40 is shown in a compact folded-up and closed arrangement in which all the brackets are brought together. In this compact arrangement, the hinging components 60 of the hinging assembly 44 are substantially aligned in a straight line. FIG. 12 shows an empty mounting system 40 without any installed electronic devices and FIG. 13 shows the mounting system 40 with a number of installed electronic devices 50, 52, 54.

As mentioned, the hinging components 60 of the hinging assembly 44 may directly support rack-mount electronic devices in a canter levered manner or alternatively may indirectly support the electronic devices by support brackets that are arranged to receive and retain rack-mount electronic devices. In particular, each hinging component 60 may support a 1 U rack-mount device directly by the electronic device being screwed directly into the hinging component or alternatively the hinging component may indirectly support the 1 U rack-mount device by supporting a 1 U bracket that is arranged to receive and retain the 1 U rack-mount device. As mentioned, two or more adjacent hinging components may cooperate together to directly or indirectly support larger rack-mount electronic devices having an integer size of 2 U or above. In particular, the number of hinging components required is equal to the integer height of the device to be supported. Therefore, in alternative embodiments separate brackets, like those described in respect of FIGS. 16, 17 and 19 do not necessarily have to be used. However, the use of such modular brackets provides increased support and the ability of locking the supported components together in a compact arrangement.

In operation, the doors of the housing may be opened by a user to provide access to the mounting system 40 as previously described. To obtain access to a selected bracket for the installation or removal of an electronic device, the locking mechanism associated with that bracket in front of that selected bracket is operated to enable those brackets in front of the selected bracket to pivot away from the selected bracket to provide access. For example and with reference to FIG. 13, if the locking pin 78 of the locking mechanism of the front 1 U dual bracket 62 is pulled into the unlocked position, this allows the 1 U dual bracket 62 to be folded or swung outwardly about the pivot axis indicated generally by G of its associated hinging component thereby allowing access to the first of the 1 U single brackets 64. Once the installation, removal or maintenance of an already installed electronic device is complete, the brackets in front of the selected bracket may be moved back into a substantially abutting relationship with the selected bracket and may then be locked securely to prevent movement.

It will be appreciated that the locking mechanisms for each bracket may be manipulated to separate the brackets or groups of adjacent brackets in various ways, with the extreme case being the fanned-out arrangement shown in FIG. 11 in which none of the brackets are locked together.

Figure 21:
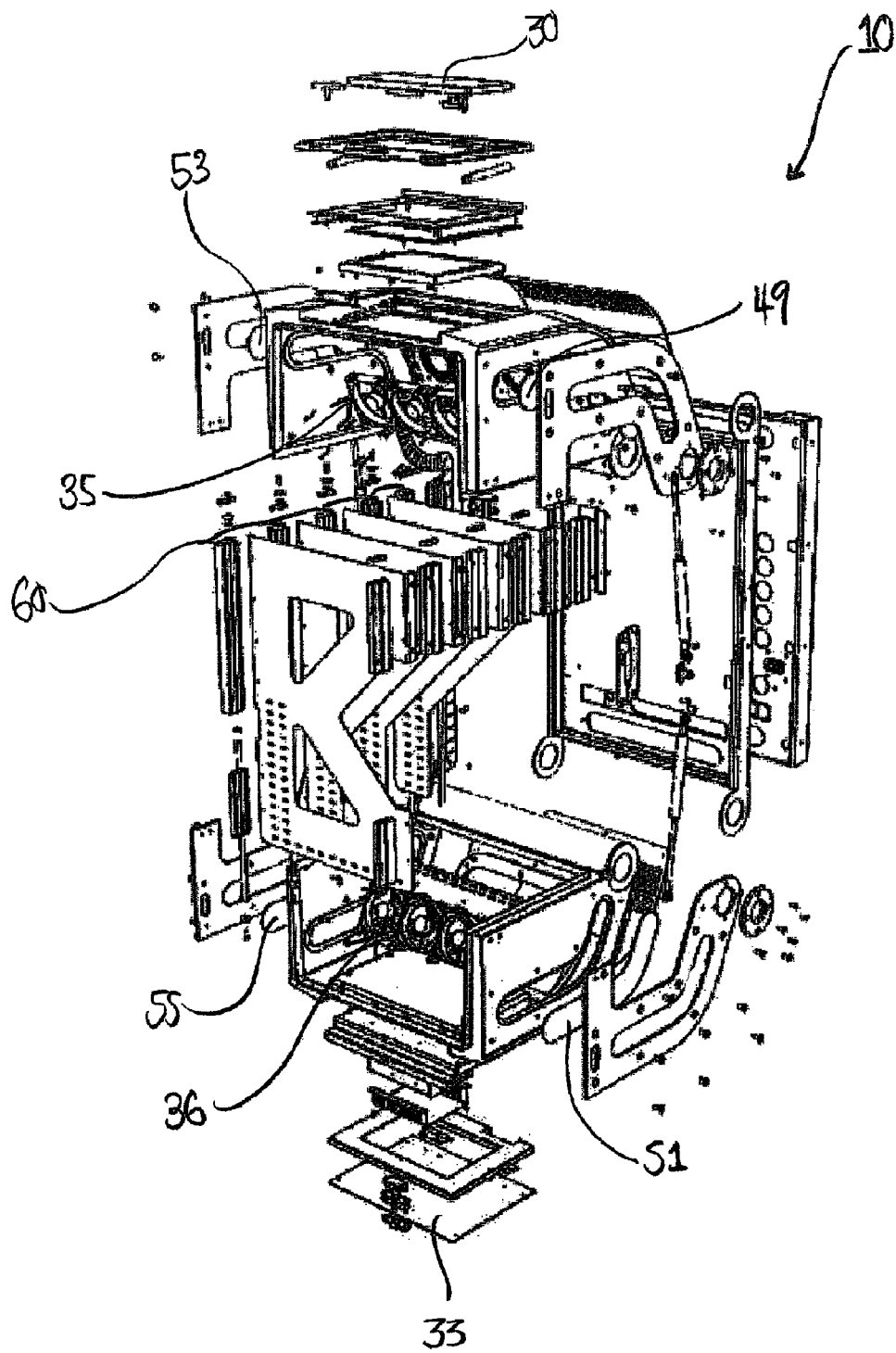
FIG. 21 shows a fully exploded front right-side perspective view of the preferred embodiment storage unit.

Referring to FIGS. 20 and 21, partial and fully exploded views of the components of the preferred embodiment storage unit 10 are shown in more detail by way of example only. It will be appreciated that the components may be formed from plastic, metal, aluminum or any other suitable material and any combination of such materials. Further, it will be appreciated that the components shown in FIGS. 20 and 21 are just one possible construction of the storage unit and that the components may be altered or formed in various other ways depending on the design requirements.

As previously mentioned, the storage unit 10 may be mountable to a wall or the like in the vertical orientation shown in FIGS. 1A and 1B. It will be appreciated that the storage unit may alternatively be stored on the ground or floor or on a shelf or in a cupboard if desired with the base plate 11 resting on the floor, ground or other horizontal surface.

Figure 22:
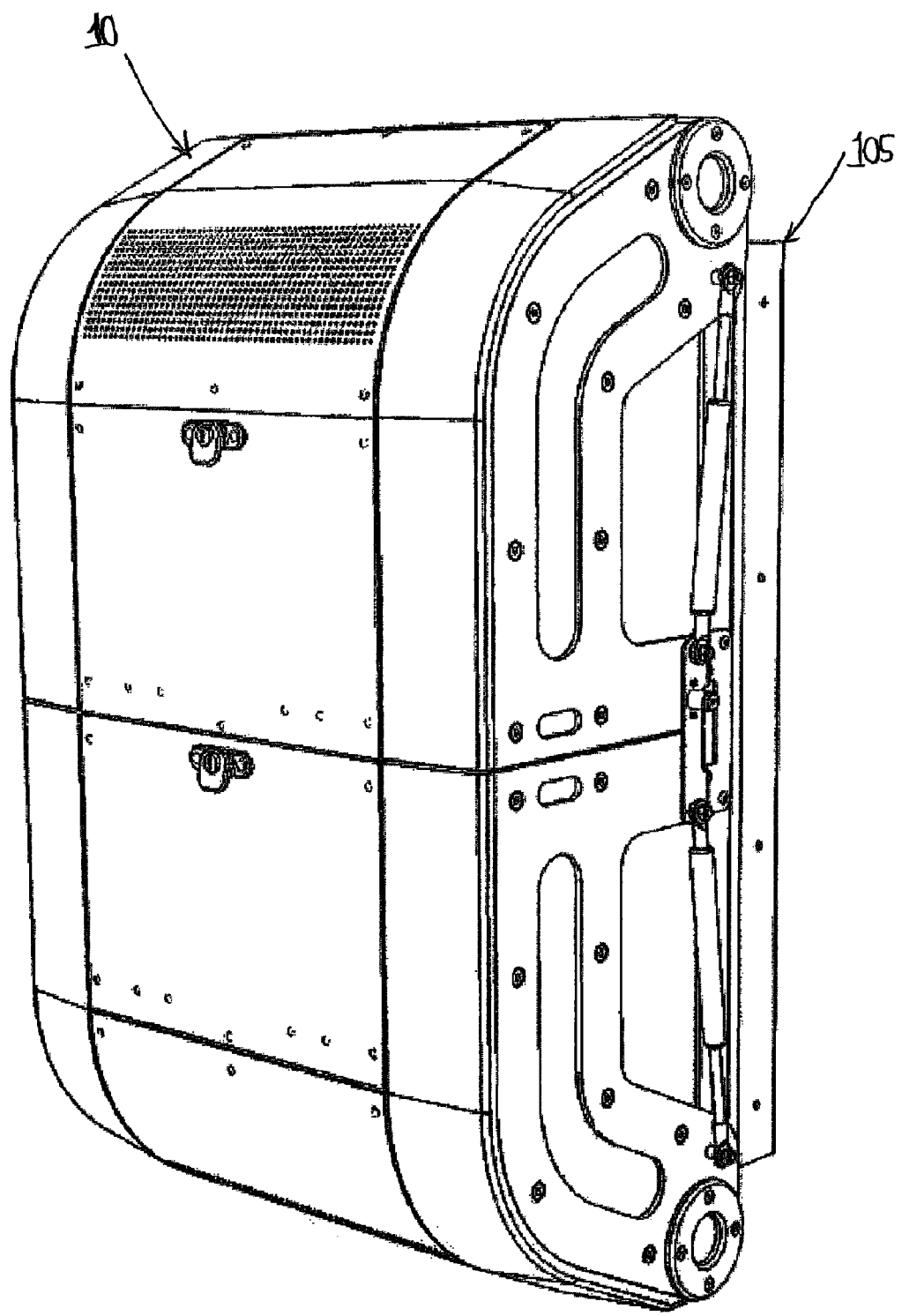
FIGS. 22 and 23 show front and rear perspective views respectively of the preferred embodiment storage unit being supported by a wall-mount bracket.
Figure 23:
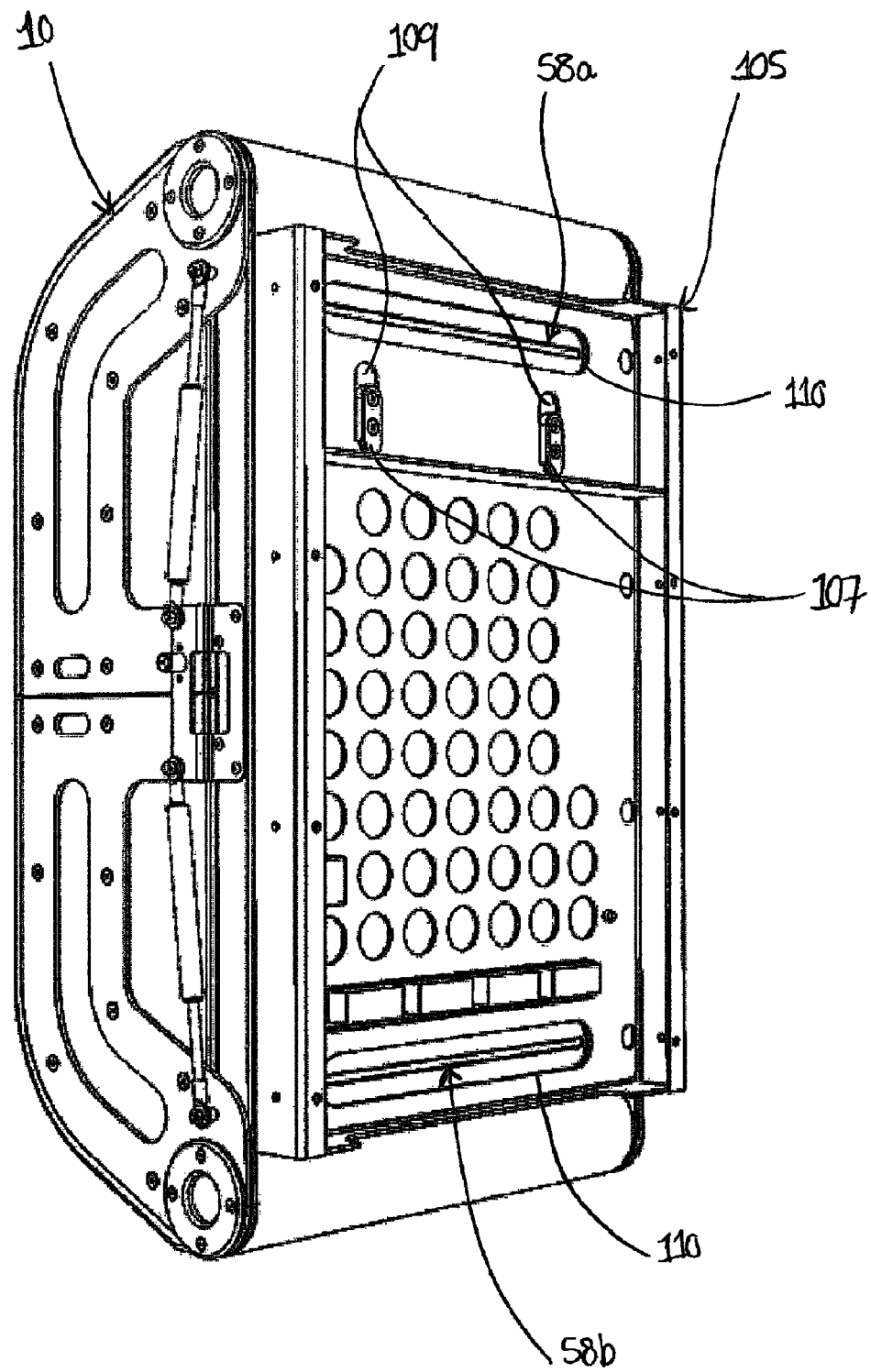

Referring to FIGS. 22-25 two mounting accessories and assemblies for the storage unit are shown. Referring to FIGS. 22 and 23, the storage unit 10 is shown supported on wall-mount bracket 105. In operation, the wall-mount bracket 105 may be securely fixed to a wall or the like and then the storage unit 10 may be releasably secured to the wall-mount bracket 105. In particular, the wall-mount bracket 105 is arranged to abut the base plate 11 of the housing of the storage unit 10 and supports the storage unit 10 via hooks 107 that extend from the base plate and which are securely engageable with complementary slots 109 of the wall-mount bracket 105. The hooks 107 of the storage unit 10 are visible also in FIG. 1B.

Figure 24:
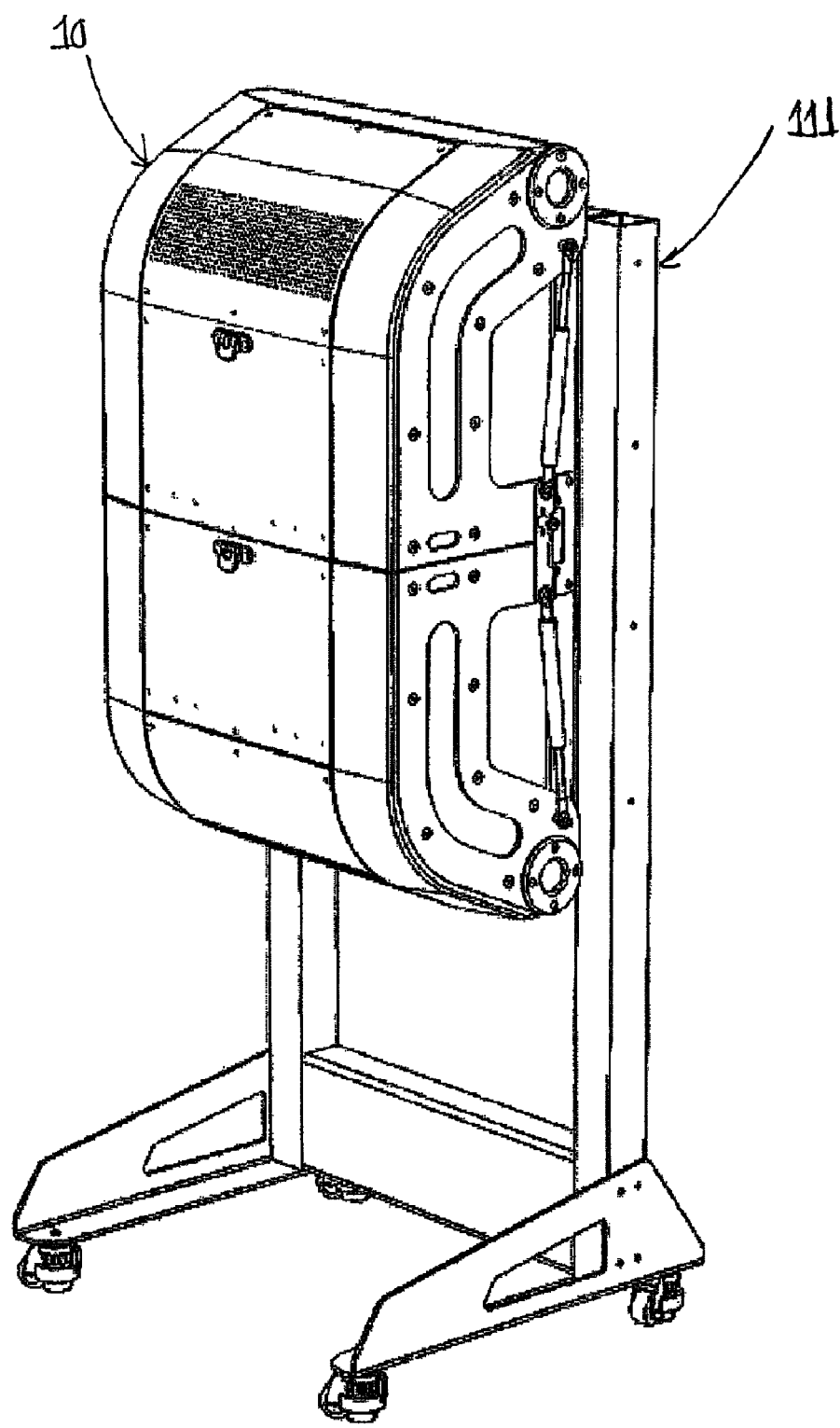
FIGS. 24 and 25 show a front and rear perspective views respectively of the preferred embodiment storage unit being supported by a freestanding support frame.
Figure 25:
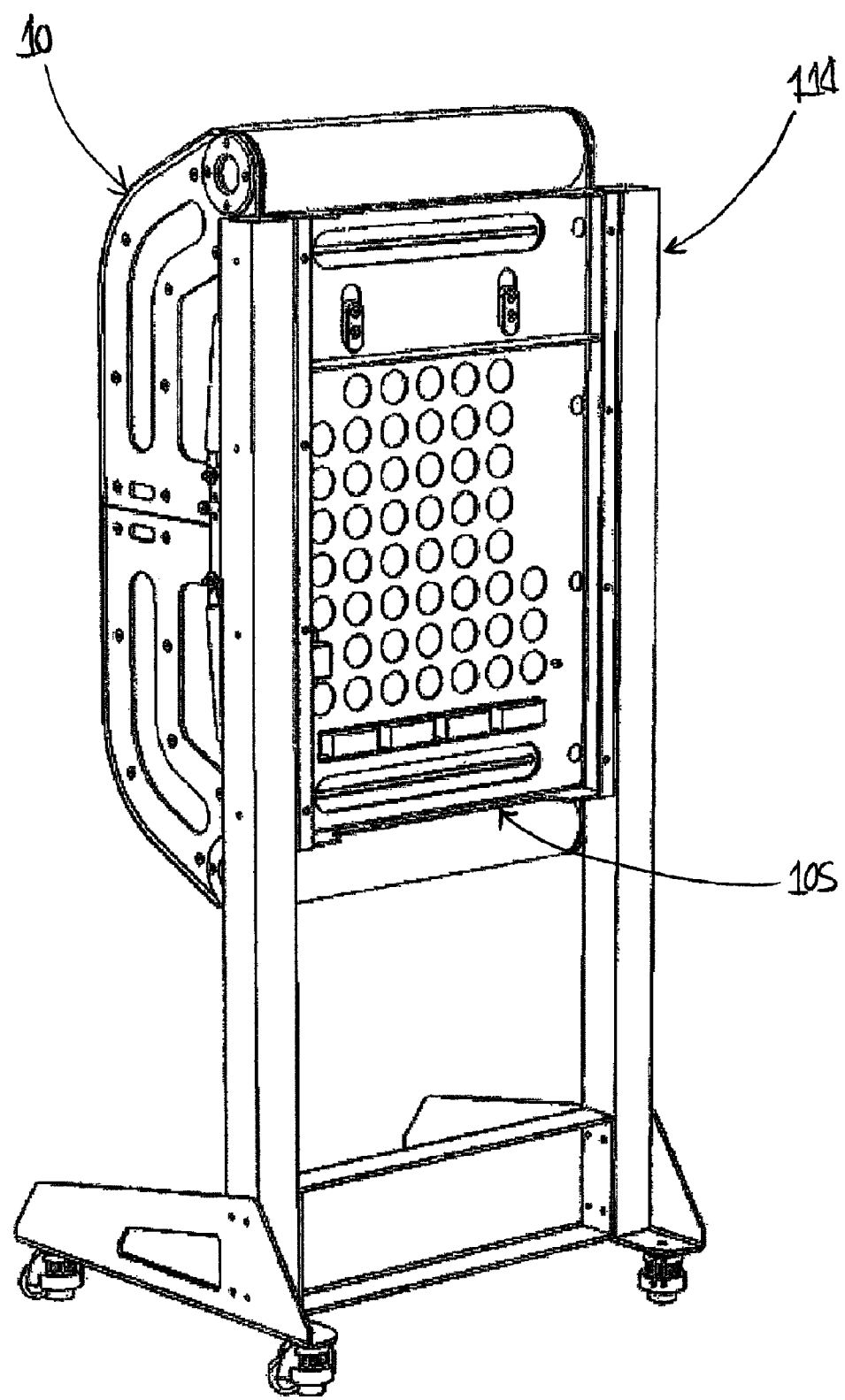

Referring to FIGS. 24 and 25, the storage unit 10 is shown supported by a freestanding support frame 111 shown. By way of example, the freestanding support frame 111 may comprise the wall-mount bracket 105 described in respective FIGS. 22 and 23 and the storage unit 10 may be releasably supported in a similar manner. The freestanding support frame 111 is useful in situations where no load bearing walls or vertical surfaces are available for the storage unit 10.

Referring to FIGS. 26 and 27, an example of manifold components 113 for connecting air-conditioning ducting of an external air-conditioning unit to the upper 58a and lower 58b slots in the base plate 11 of the housing are shown.

Referring to FIG. 23, the wall-mount bracket 105 is provided with complimentary slots 110 that are aligned with the upper 58a and lower 58b slots of the base plate 11. As shown in FIGS. 26 and 27, the manifold components 113 may be securely fixed to the back of the wall-mount bracket 105 such that they operatively connect to the upper 58a and lower 58b slots of the base plate 11 via the complimentary slots 110 of the wall-mount bracket 105.

Figure 28:
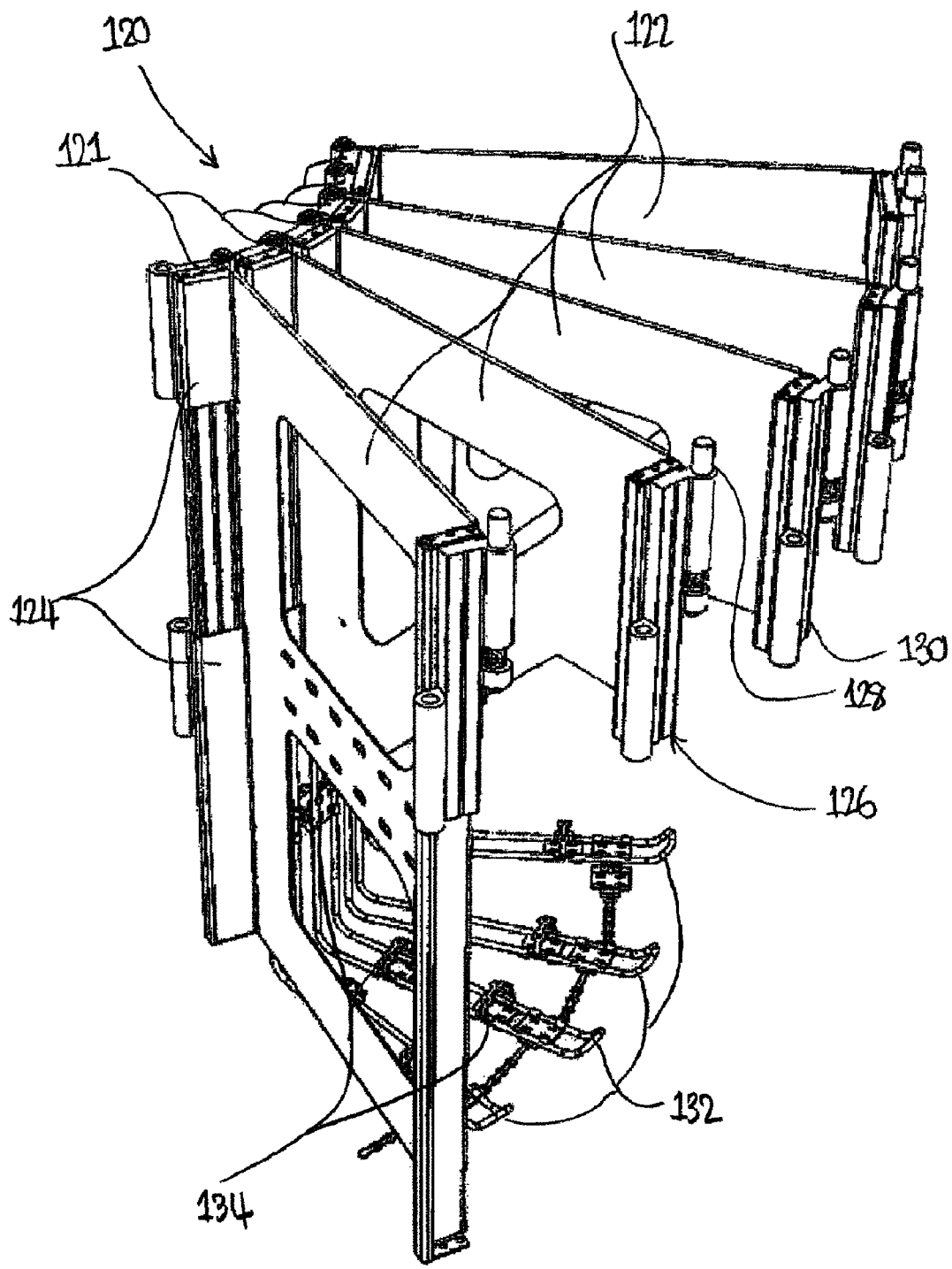
FIG. 28 shows a front perspective view of an alternative embodiment mounting system for the storage unit in its right, empty, and positioned in a fanned-out arrangement.
Figure 29:
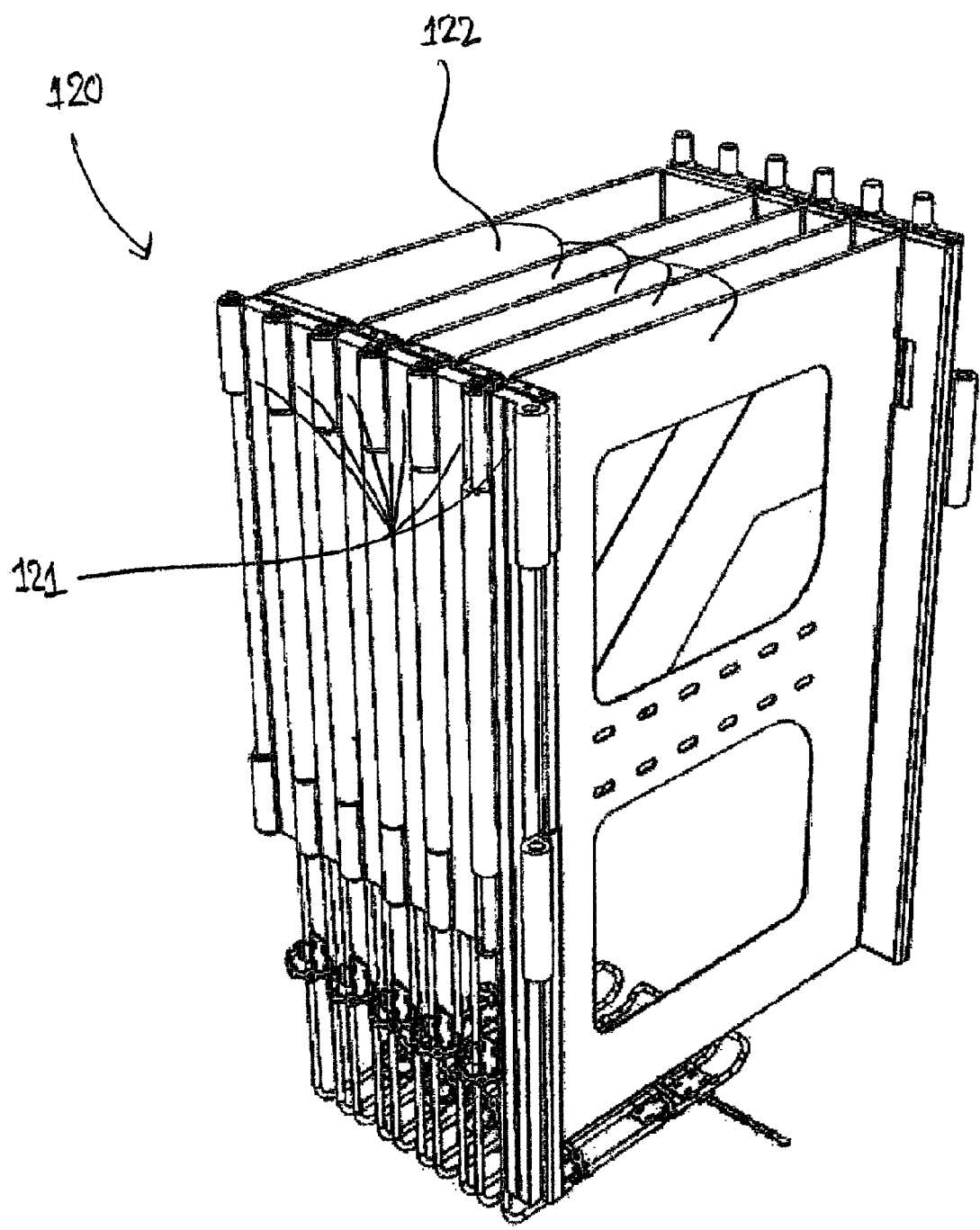
FIG. 29 shows a rear perspective view of the alternative embodiment mounting system of FIG. 28, positioned in a compact arrangement.

Referring to FIGS. 28 and 29, an alternative embodiment mounting system 120 for the storage unit is shown. This mounting system 120 may be used in the storage unit as an alternative to the preferred embodiment mounting system 40 previously described. The overall functionality and operation of the mounting system 120 is similar to mounting system 40 but the main differences will be explained. The hinging components 121 of the hinging assembly of the mounting system 120 are similar to those described in respect of the preferred embodiment mounting system 40 but the form of the brackets 122 is modified. The first bracket is a 1 U dual bracket, the next three brackets are 1 U single brackets and the fifth bracket is a 2 U single bracket. These brackets are modular and each comprise two rear end guides 124 that are arranged as sleeves that securely and slidably engaged with one or more of the hinging components. In particular, the four front 1 U brackets are each arranged to securely engage with a single hinging component 121 of the hinging assembly. The 2 U bracket is larger and its rear end guides are larger and arranged to securely engage with two adjacent hinging components 121 to effectively lock those two hinging components together as one hinging component.

Each bracket 122 also comprises a front end guide 126 that comprises a locking mechanism for engaging with a like locking mechanism of an adjacent bracket. For example, each locking mechanism comprises a vertically operable locking pin 128 that is arranged to engage into a complimentary locking barrel 130 of an adjacent bracket to secure the brackets together. The 1 U and 2 U single brackets are also provided with device support bars 132. In the preferred embodiment, the device support bar 132 is formed from a single rod that is shaped to form two parallel rails that meet together to form a half-bent U-shaped end. Along the length of the device support bar 132 is also provided a number of resilient cushioning components 134 upon or against which the rack-mount electronic devices may rest. In the preferred form, the resilient cushioning components 134 may be looped members of resilient material and the loops may also provide a guide for management of cables that are connected to the electronic devices. It will be appreciated that the alternative embodiment mounting system 120 may be arranged to comprise any mix of different sized brackets. The integer U-size of the bracket corresponds to the number of adjacent hinging components 121 that are required to support the bracket and which are locked together once the bracket is installed. For the 1 U brackets, only a single hinging component 121 is required.

In an alternative embodiment, the storage unit or assembly may essentially comprise a mounting system alone without an associated housing for enclosing the mounting system. In such an embodiment, the mounting system may be fixed directly to a vertical surface such as a wall or may alternatively be fixed to a mounting plate, base plate or the like than can in turn be stored on the floor or secured to a wall. Such a mounting system on its own could be utilised where environmental control is not imperative.

In summary, the storage unit is capable of housing a number of rack-mount electronic devices of varying heights and sizes. The storage unit is arranged to be mounted to a wall or alternatively can be placed on the ground in an appropriate location within a room or the like. The storage unit is useful system for housing and mounting a number of electronic devices that form part of a system or alternatively a small group of independent electronic devices that need to be stored in the same vicinity. By way of example, the storage unit may be utilised to house small computer server systems or any other systems having a relatively small number of components. In particular, although not exclusively, the storage unit may be utilised in, for example, the telecommunication, computing and entertainment industries, as well as others.

The foregoing description of the invention includes preferred forms thereof. Modifications may be made thereto without departing from the scope of the invention as defined by the accompanying claims.

The invention claimed is:

1. A rack-mount electronic device storage unit for storing rack-mount electronic devices comprising:
   an openable housing; and
   a mounting system mounted within the housing for receiving and retaining one or more rack-mount electronic devices, the mounting system comprising:
   a hinging assembly comprising a chain of two or more hinging components that are interconnected for hinged movement relative to each other such that each pair of adjacent hinging components of the chain are pivotably coupled about a respective common pivot axis for hinged movement about that pivot axis; and
   a set of two or more modular brackets releasably supported by the hinging assembly for hinged movement relative to each other about respective pivot axes of the hinging assembly to enable access to each bracket, each bracket being configured and dimensioned to releasably receive and retain one or more rack-mount electronic devices via slidable engagement of the devices into the bracket and each bracket comprising an attachment part that is configured to releasably couple the bracket to one or more adjacent hinging components of the hinging assembly to support the bracket on the hinging assembly.

2. A rack-mount electronic device storage unit according to claim 1 wherein the hinging assembly is arranged to support the brackets in a cantilevered fashion such that each bracket is hingedly movable between an abutting relationship with adjacent brackets and a non-abutting relationship with adjacent brackets in order to enable access to the bracket.

3. A rack-mount electronic device storage unit according to claim 1 wherein each bracket is configured and dimensioned to receive and retain one or more 19-inch rack-mount electronic devices of a particular U-size, and wherein each bracket is releasably coupled to either one or multiple adjacent hinging components of the hinging assembly, the number of hinging components required to releasably couple to each bracket being equal to the number in the U-size of the bracket.

4. A rack-mount electronic device storage unit according to claim 3 wherein larger brackets that require multiple adjacent hinging components of the hinging assembly for support are arranged to couple those adjacent hinging components together to prevent them from hingedly moving relative to each other such that they collectively form a larger hinging component for the larger bracket.

5. A rack-mount electronic device storage unit according to claim 1 wherein the brackets are supported by the hinging assembly in a cantilever fashion.

6. A rack-mount electronic device storage unit according to claim 1 wherein each bracket is provided with an operable locking mechanism that is arranged to cooperate with a like locking mechanism of an adjacent bracket to lock the brackets together to prevent hinged movement of those brackets relative to each other.

7. A rack-mount electronic device storage unit according to claim 1 wherein the housing comprises one or more openable doors for opening and closing the housing.

8. A rack-mount electronic device storage unit according to claim 1 wherein the housing comprises a base plate and two opposed openable doors that are hingedly attached to the base plate via hinging mechanisms at either end of the base plate.

9. A rack-mount electronic device storage unit according to claim 8 wherein the doors of the housing are hingedly attached such that they are both movable between closed and open positions, such that when both doors are in the closed position the mounting system and any installed electronic devices are enclosed within the housing and when both the doors are in an open position the mounting system and any electronic devices are exposed and accessible.

10. A rack-mount electronic device storage unit according to claim 9 wherein the doors of the housing have an associated locking mechanism that is operable to lock the doors in a closed position.

11. A rack-mount electronic device storage unit according to claim 10 wherein the hinging assembly of the mounting system is fixed within the housing to the base plate of the housing.

12. A rack-mount electronic device storage unit according to claim 1 further comprising a temperature control system for controlling the temperature within the housing.

13. A rack-mount electronic device storage unit according to claim 12 wherein the temperature control system comprises an integrated cooling system that comprises one or more operable fans that are arranged to create ventilating air flows through the housing and associated vents of the housing.

14. A rack-mount electronic device storage unit according to claim 12 wherein the temperature control system comprises an external air conditioning system that is arranged to connect to the housing to provide a flow of conditioned air to control one or more environmental parameters or conditions within the internal environment of the housing.

15. A rack-mount electronic device storage unit according to claim 12 wherein the temperature control system comprises monitoring sensors that are arranged to measure particular environmental parameters within the internal environment of the housing, the temperature control system being arranged to control the temperature within the housing in response to the measured parameters.

16. A rack-mount electronic device storage unit according to claim 1 wherein the housing comprises a user interface that is arranged to communicate with one or more of the electronic devices retained within the storage unit.

17. A rack-mount electronic device storage unit according to claim 1 wherein the housing is releasably securable to a wall-mount bracket that is arranged to be fixed to a wall or other vertical surface or frame.

18. A rack-mount electronic device storage unit according to claim 1 wherein each bracket comprises a backing plate having a front end guide and a rear end guide disposed on opposing edges of the backing plate and which are configured to slidably guide an electronic device into a securely retained position against the backing plate.

19. A rack-mount electronic device storage unit according to claim 18 wherein the rear end guide of each bracket comprises the attachment part for releasably coupling the bracket to the hinging components of the hinging assembly.

20. A rack-mount electronic device storage unit according to claim 19 wherein the attachment part of each bracket is configured to slidably engage with any of the hinging components of the hinging assembly to releasably couple the bracket to the hinging assembly.

21. A rack-mount electronic device storage unit according to claim 1 wherein each hinging component is elongate and each pair of adjacent hinging components of the chain of hinging components of the hinging assembly are pivotably coupled by aligned complementary cylinders extending from each hinging component through which a common interlocking pivot rod extends to form the pivot axis for the pair of hinging components.

22. A rack-mount electronic device storage unit according to claim 1 wherein all the brackets are the same size such that the storage unit receives and retains rack-mount electronic devices of the same size.

23. A rack-mount electronic device storage unit according to claim 1 comprising at least two different sizes of brackets such that the storage unit can receive and retain rack-mount electronic devices of different sizes.

24. A rack-mount electronic device storage assembly for storing rack-mount electronic devices comprising:
   a mounting system for receiving and retaining one or more rack-mount electronic devices, the mounting system comprising:
   a hinging assembly comprising a chain of two or more adjacent hinging components that are interconnected for hinged movement relative to each other such that each pair of adjacent hinging components of the chain are pivotably coupled about a common pivot axis for hinged movement about that pivot axis; and
   a set of two or more modular brackets releasably supported by the hinging assembly for hinged movement relative to each other about respective pivot axes of the hinging assembly to enable access to each bracket, each bracket being configured and dimensioned to releasably receive and retain one or more rack-mount electronic devices via slidable engagement of the device(s) into the bracket and each bracket comprising an attachment part that is configured to releasably couple the bracket to one or more adjacent hinging components of the hinging assembly to support the bracket on the hinging assembly.

25. A rack-mount electronic device storage assembly according to claim 24 wherein the hinging assembly is arranged to support the brackets in a cantilevered fashion such that each bracket is hingedly movable between an abutting relationship with adjacent brackets and a non-abutting relationship with adjacent brackets in order to enable access to the bracket.

26. A rack-mount electronic device storage assembly according to claim 24 wherein each bracket is configured and dimensioned to receive and retain one or more 19-inch rack-mount electronic devices of a particular U-size, and wherein each bracket is releasably coupled to either one or multiple adjacent hinging components of the hinging assembly, the number of hinging components required to releasably couple to each bracket being equal to the number in the U-size of the bracket.

27. A rack-mount electronic device storage assembly according to claim 26 wherein larger brackets that require multiple adjacent hinging components of the hinging assembly for support are arranged to couple those adjacent hinging components together to prevent them from hingedly moving relative to each other such that they collectively form a larger hinging component for the larger bracket.

28. A rack-mount electronic device storage assembly according to claim 24 wherein the brackets are supported by the hinging assembly in a cantilever fashion.

29. A rack-mount electronic device storage assembly according to claim 24 wherein each bracket is provided with an operable locking mechanism that is arranged to cooperate with a like locking mechanism of an adjacent bracket to lock the brackets together to prevent hinged movement of those brackets relative to each other.

30. A rack-mount electronic device storage assembly according to claim 24 further comprising a mounting plate to which the mounting system is fixed.

31. A rack-mount electronic device storage assembly according to claim 24 wherein each bracket comprises a backing plate having a front end guide and a rear end guide disposed on opposing edges of the backing plate and which are configured to slidably guide an electronic device into a securely retained position against the backing plate.

32. A rack-mount electronic device storage assembly according to claim 31 wherein the rear end guide of each bracket comprises the attachment part for releasably coupling the bracket to any of the hinging components of the hinging assembly.

33. A rack-mount electronic device storage assembly according to claim 32 wherein the attachment part of each bracket is configured to slidably engage with any of the hinging components of the hinging assembly to releasably couple the bracket to the hinging assembly.

34. A rack-mount electronic device storage assembly according to claim 24 wherein each hinging component is elongate and each pair of adjacent hinging components of the chain of hinging components of the hinging assembly are pivotably coupled by aligned complementary cylinders extending from each hinging component through which a common interlocking pivot rod extends to form the pivot axis for the pair of hinging components.

35. A rack-mount electronic device storage assembly according to claim 24 wherein all the brackets are the same size such that the storage assembly can receive and retains rack-mount electronic devices of the same size.

36. A rack-mount electronic device storage assembly according to claim 24 comprising at least two different sizes of brackets such that the storage assembly can receive and retain rack-mount electronic devices of at least two different sizes.

\* \* \* \* \*